(12) United States Patent
Dorhout et al.

(10) Patent No.: US 11,329,062 B2
(45) Date of Patent: May 10, 2022

(54) MEMORY ARRAYS AND METHODS USED IN FORMING A MEMORY ARRAY

(71) Applicant: Micron Technology, Inc., Boise, ID (US)

(72) Inventors: Justin B. Dorhout, Boise, ID (US); Erik Byers, Boise, ID (US); Merri L. Carlson, Boise, ID (US); Indra V. Chary, Boise, ID (US); Damir Fazil, Boise, ID (US); John D. Hopkins, Meridian, ID (US); Nancy M. Lomeli, Boise, ID (US); Eldon Nelson, Dripping Springs, TX (US); Joel D. Peterson, Boise, ID (US); Dimitrios Pavlopoulos, Glendale, CA (US); Paolo Tessariol, Arcore (IT); Lifang Xu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/230,382

(22) Filed: Dec. 21, 2018

(65) Prior Publication Data
US 2020/0127004 A1 Apr. 23, 2020

Related U.S. Application Data

(60) Provisional application No. 62/746,728, filed on Oct. 17, 2018.

(51) Int. Cl.
*H01L 21/768* (2006.01)
*H01L 27/11582* (2017.01)
(Continued)

(52) U.S. Cl.
CPC .. *H01L 27/11582* (2013.01); *H01L 21/76802* (2013.01); *H01L 27/1157* (2013.01); *H01L 29/66833* (2013.01); *H01L 29/7926* (2013.01)

(58) Field of Classification Search
CPC ......... H01L 27/11582; H01L 27/11556; H01L 27/11578; H01L 27/1157; H01L 27/11565;
(Continued)

(56) References Cited

U.S. PATENT DOCUMENTS

| | | |
|---|---|---|
| 5,189,504 A | 2/1993 | Nakayama et al. |
| 6,949,829 B2 | 9/2005 | Akahori et al. |

(Continued)

FOREIGN PATENT DOCUMENTS

| | | |
|---|---|---|
| TW | 530380 | 5/2003 |
| WO | WO 2018/174966 | 9/2018 |
| WO | WO 2018/194750 | 10/2018 |

OTHER PUBLICATIONS

U.S. Appl. No. 16/675,901, filed Nov. 6, 2019, by Hopkins et al.
(Continued)

*Primary Examiner* — David Chen
(74) *Attorney, Agent, or Firm* — Wells St. John P.S.

(57) ABSTRACT

A method used in forming a memory array comprises forming a stack comprising vertically-alternating insulative tiers and wordline tiers. The stack comprises an insulator tier above the wordline tiers. The insulator tier comprises first insulator material comprising silicon, nitrogen, and one or more of carbon, oxygen, boron, and phosphorus. The first insulator material is patterned to form first horizontally-elongated trenches in the insulator tier. Second insulator material is formed in the first trenches along sidewalls of the first insulator material. The second insulator material is of different composition from that of the first insulator material
(Continued)

and narrows the first trenches. After forming the second insulator material, second horizontally-elongated trenches are formed through the insulative tiers and the wordline tiers. The second trenches are horizontally along the narrowed first trenches laterally between and below the second insulator material. Elevationally-extending strings of memory cells are formed in the stack. Structure independent of method is disclosed.

19 Claims, 19 Drawing Sheets

(51) Int. Cl.
    *H01L 27/1157*    (2017.01)
    *H01L 29/792*     (2006.01)
    *H01L 29/66*      (2006.01)

(58) Field of Classification Search
    CPC ............ H01L 29/7926; H01L 23/5226; H01L 21/76805; H01L 21/76831; H01L 29/66833; H01L 21/76802; G11C 16/0483; G11C 16/0466
    USPC ........ 438/258, 287, 637; 257/324, 326, 773, 257/E21.158, E21.423, E21.679, E27.103
    See application file for complete search history.

(56) References Cited

U.S. PATENT DOCUMENTS

| | | | | |
|---|---|---|---|---|
| 8,987,805 | B2* | 3/2015 | Nam | H01L 27/11565 257/324 |
| 9,922,987 | B1 | 3/2018 | Mizuntani et al. | |
| 10,475,794 | B1 | 11/2019 | Wu et al. | |
| 2004/0041266 | A1 | 3/2004 | Akahori et al. | |
| 2007/0161221 | A1* | 7/2007 | Lee | H01L 21/76808 438/597 |
| 2008/0108193 | A1 | 5/2008 | You et al. | |
| 2009/0310425 | A1 | 12/2009 | Sim et al. | |
| 2010/0109072 | A1 | 5/2010 | Kidoh et al. | |
| 2010/0140684 | A1 | 6/2010 | Ozawa | |
| 2011/0049607 | A1 | 3/2011 | Yahashi | |
| 2011/0287612 | A1 | 11/2011 | Lee et al. | |
| 2012/0135583 | A1* | 5/2012 | Jang | H01L 21/762 438/433 |
| 2012/0211816 | A1* | 8/2012 | Yahashi | H01L 27/11573 257/314 |
| 2012/0228697 | A1 | 9/2012 | Youm et al. | |
| 2012/0235163 | A1* | 9/2012 | Watanabe | H01L 21/02381 257/77 |
| 2012/0299117 | A1 | 11/2012 | Lee et al. | |
| 2013/0161731 | A1 | 6/2013 | Bin et al. | |
| 2013/0164922 | A1 | 6/2013 | Cho et al. | |
| 2013/0270631 | A1 | 10/2013 | Kim et al. | |
| 2014/0312398 | A1* | 10/2014 | Ching | H01L 29/66795 257/288 |
| 2015/0194441 | A1 | 7/2015 | Yatsuda et al. | |
| 2015/0236038 | A1 | 8/2015 | Pachamuthu et al. | |
| 2015/0255486 | A1 | 9/2015 | Kameoka et al. | |
| 2015/0340376 | A1 | 11/2015 | Park et al. | |
| 2015/0364488 | A1 | 12/2015 | Pachamuthu et al. | |
| 2015/0372005 | A1 | 12/2015 | Yon et al. | |
| 2016/0008692 | A1 | 1/2016 | Townsend | |
| 2016/0043100 | A1* | 2/2016 | Lee | H01L 27/11565 257/324 |
| 2016/0071861 | A1 | 3/2016 | Serov et al. | |
| 2016/0093524 | A1* | 3/2016 | Izumi | H01L 27/11575 438/637 |
| 2016/0233224 | A1 | 8/2016 | Rhie | |
| 2016/0260735 | A1 | 9/2016 | Lee et al. | |
| 2016/0268297 | A1 | 9/2016 | Murakami et al. | |
| 2016/0315095 | A1 | 10/2016 | Sel et al. | |
| 2017/0256558 | A1* | 9/2017 | Zhang | H01L 27/1207 |
| 2017/0263556 | A1 | 9/2017 | Tessariol et al. | |
| 2017/0301685 | A1 | 10/2017 | Dorhout et al. | |
| 2017/0301686 | A1* | 10/2017 | Imamura | H01L 27/11565 |
| 2018/0269221 | A1* | 9/2018 | Oda | H01L 27/11565 |
| 2019/0259698 | A1 | 8/2019 | Takahashi et al. | |
| 2019/0333937 | A1 | 10/2019 | Choi et al. | |
| 2020/0273501 | A1 | 8/2020 | Yun et al. | |

OTHER PUBLICATIONS

U.S. Appl. No. 16/682,349, filed Nov. 13, 2019, by Kong et al.
U.S. Appl. No. 16/682,544, filed Nov. 13, 2019, by Bhushan et al.

\* cited by examiner

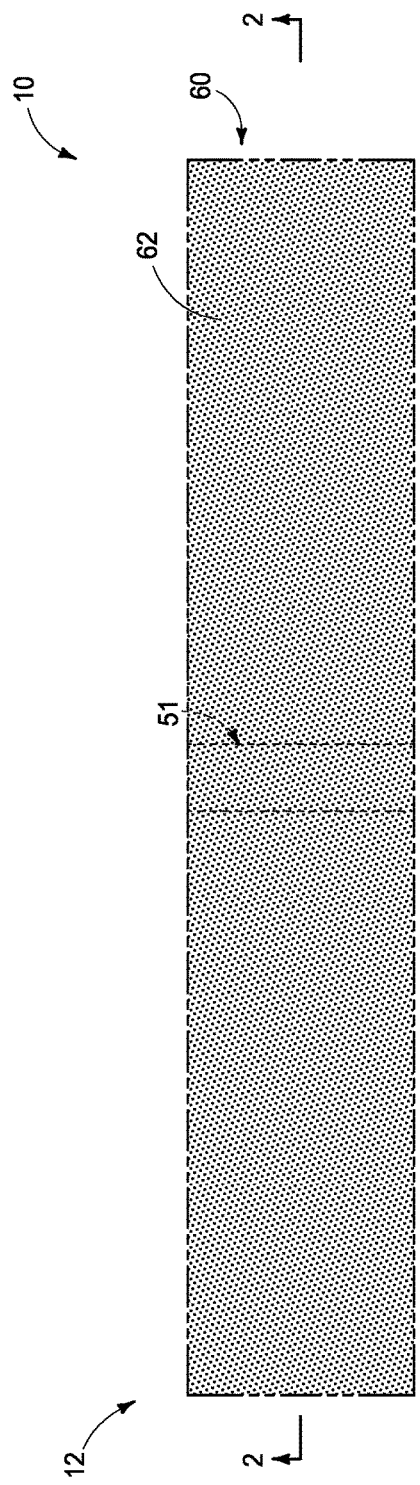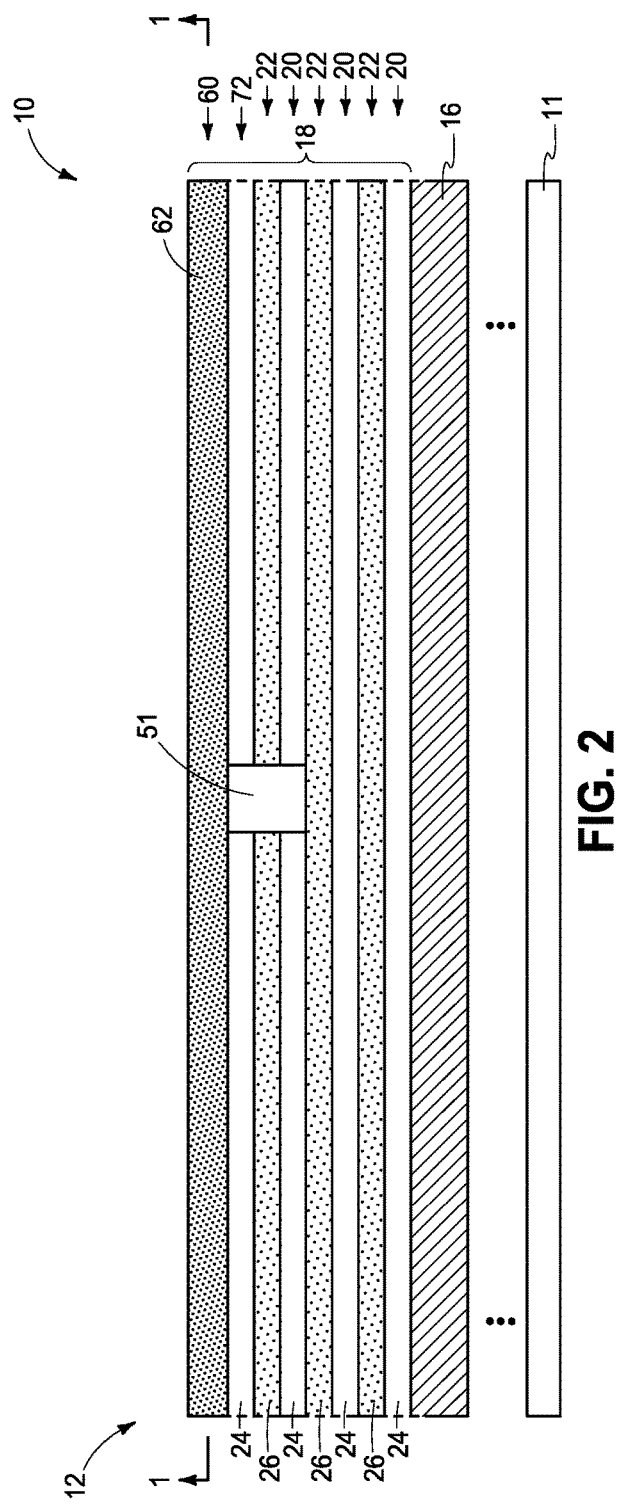

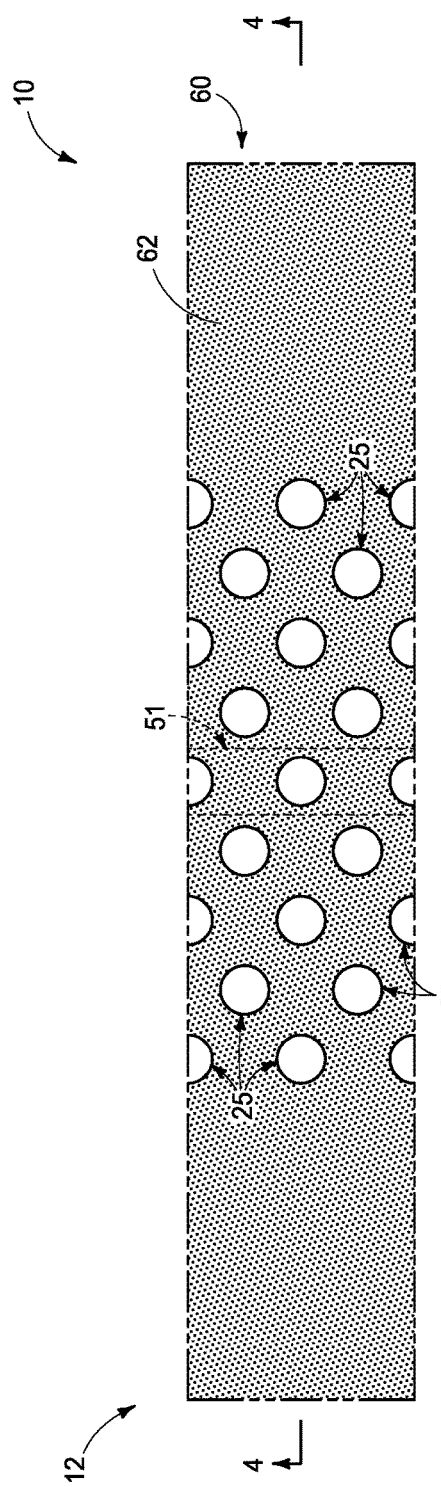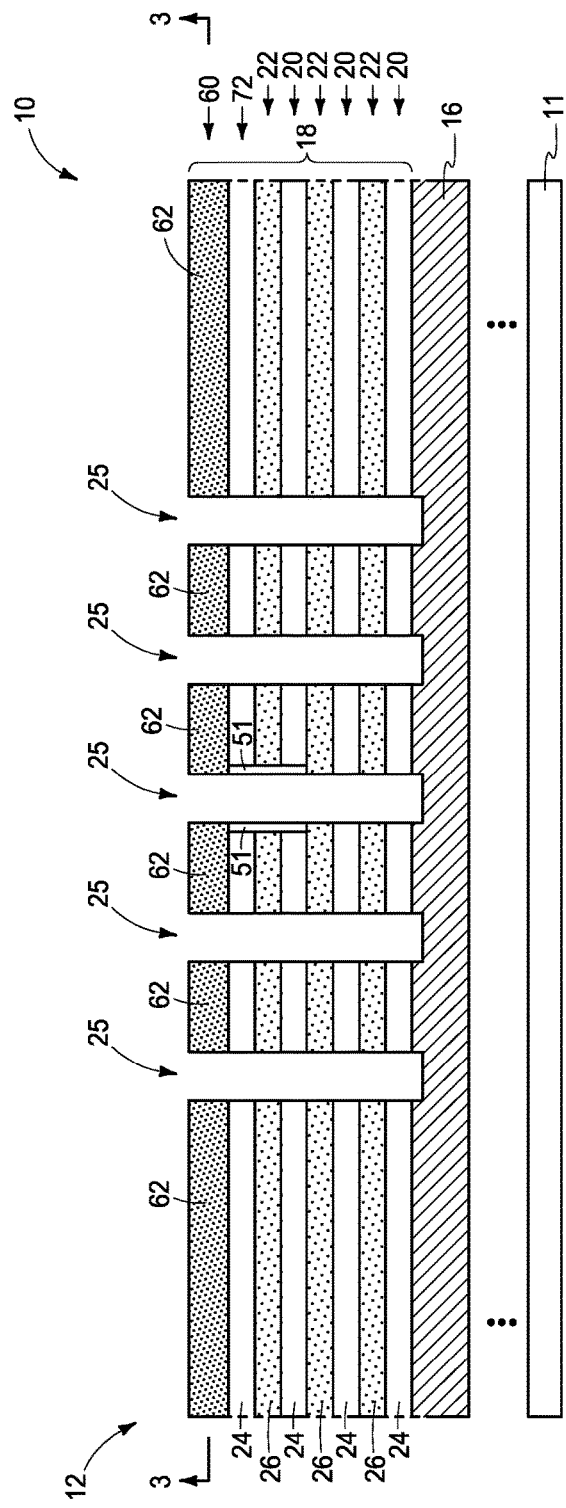

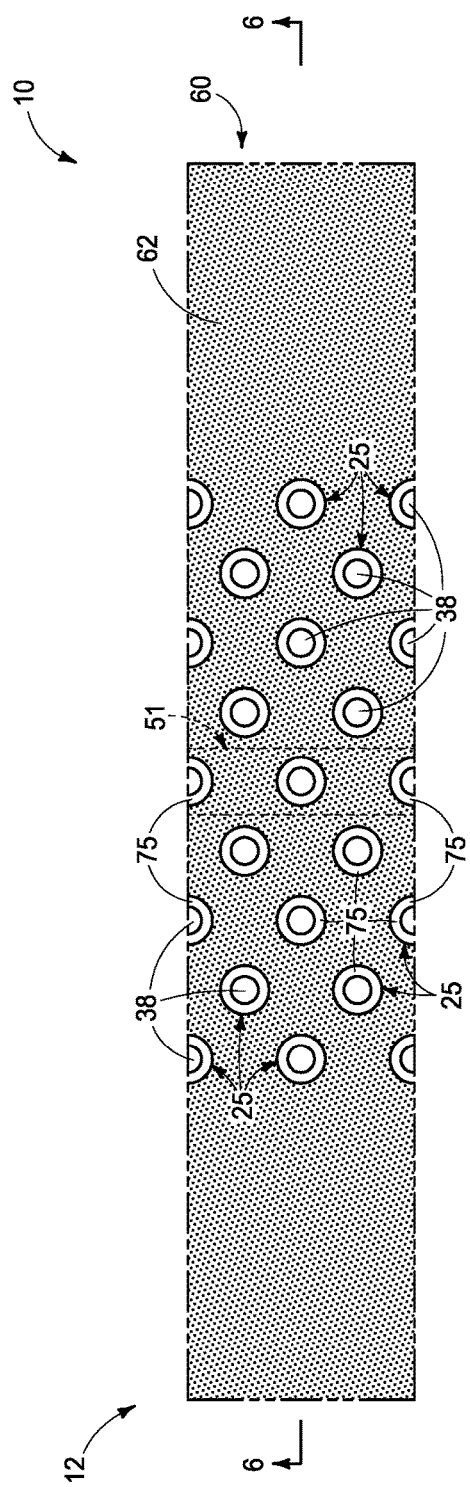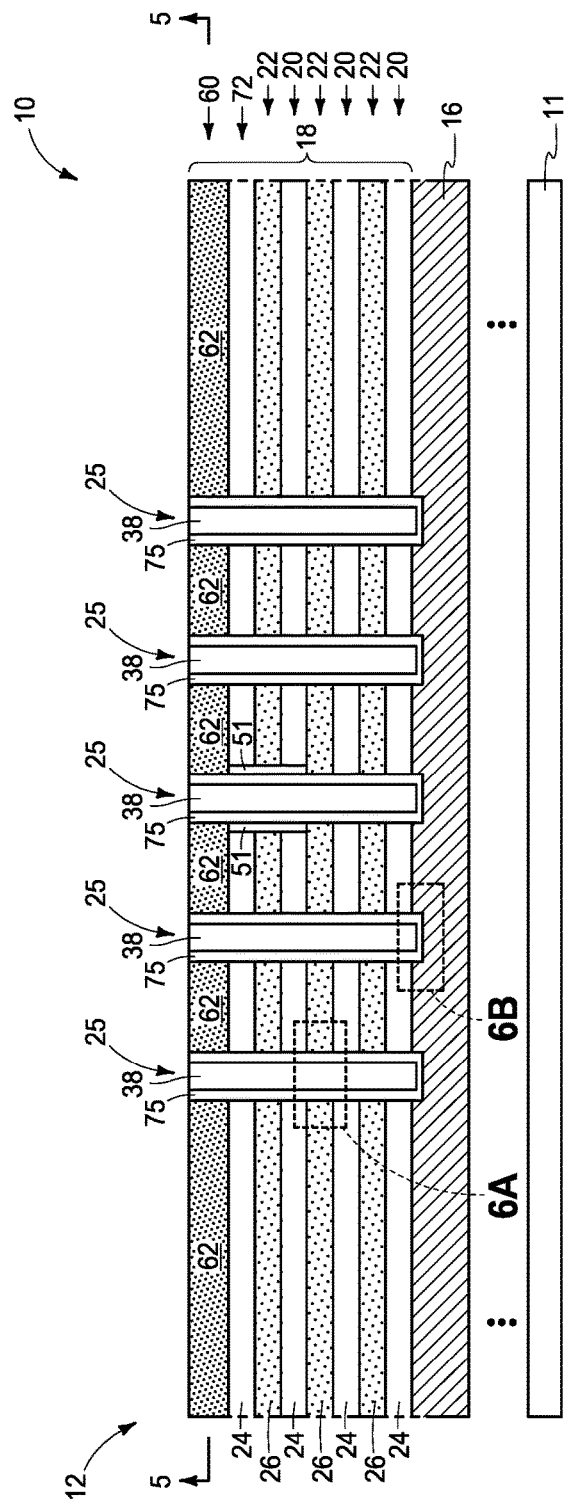

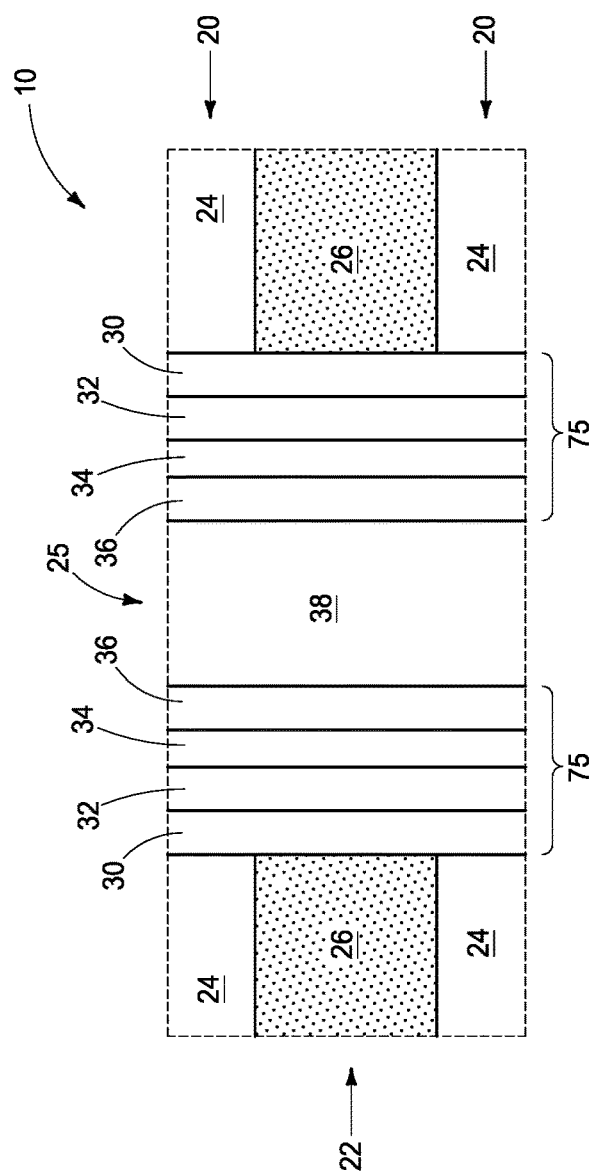
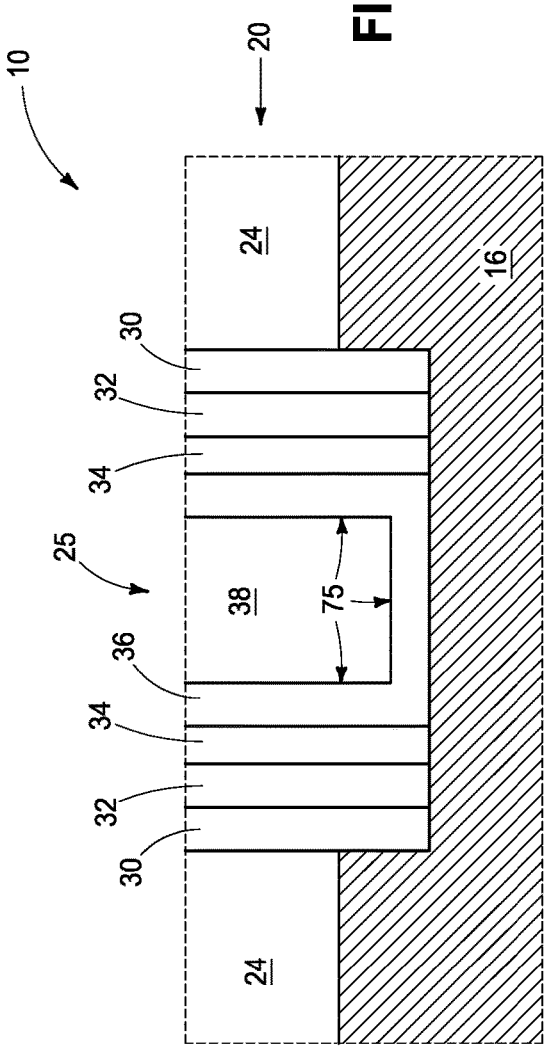

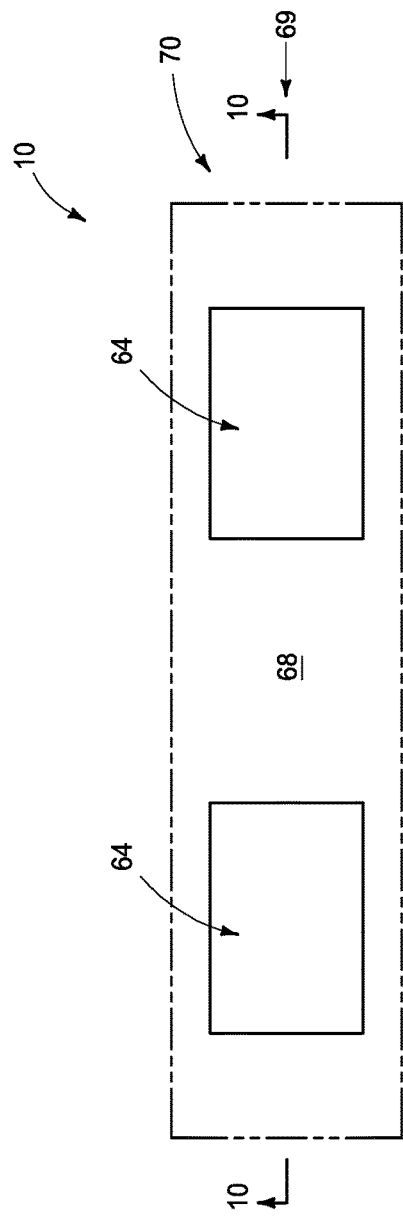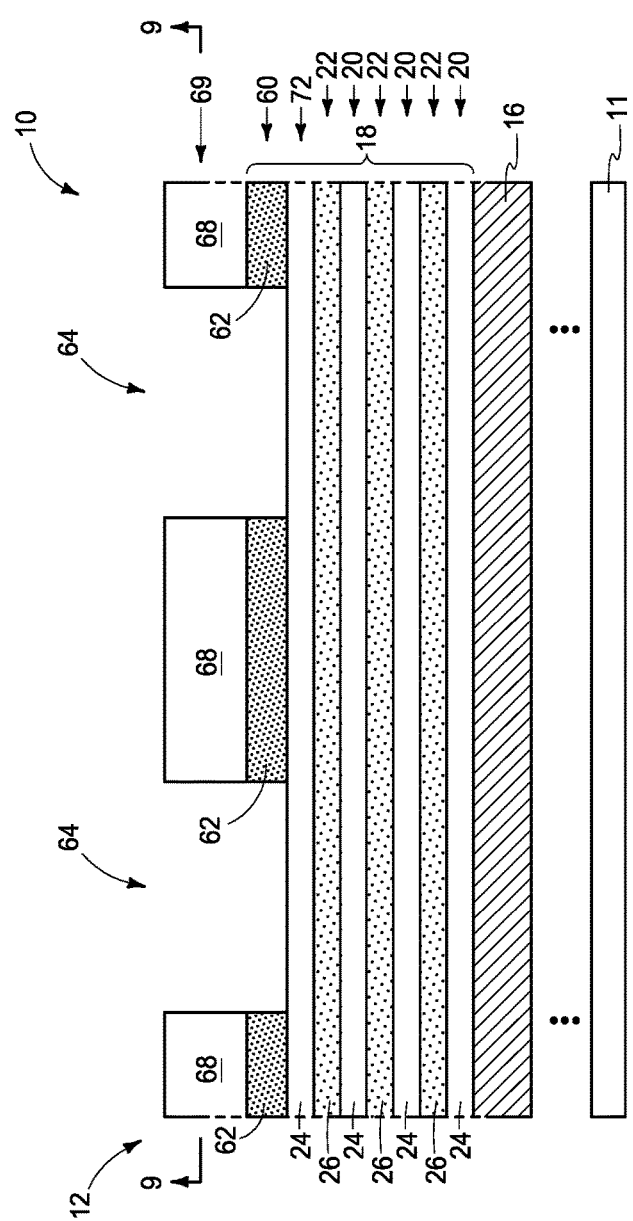

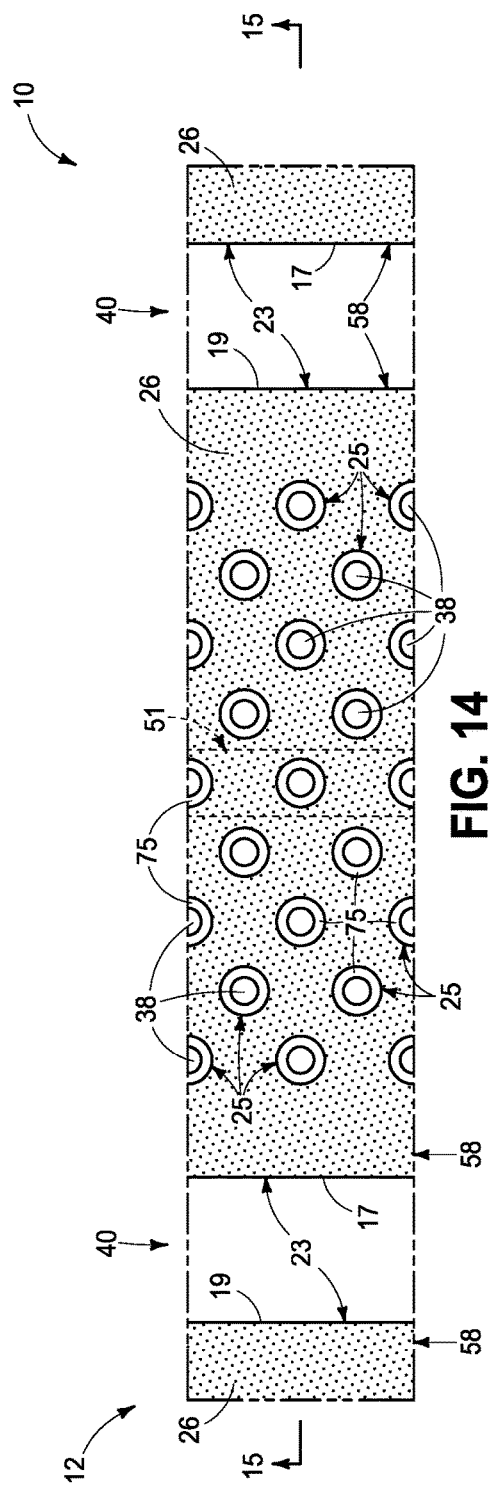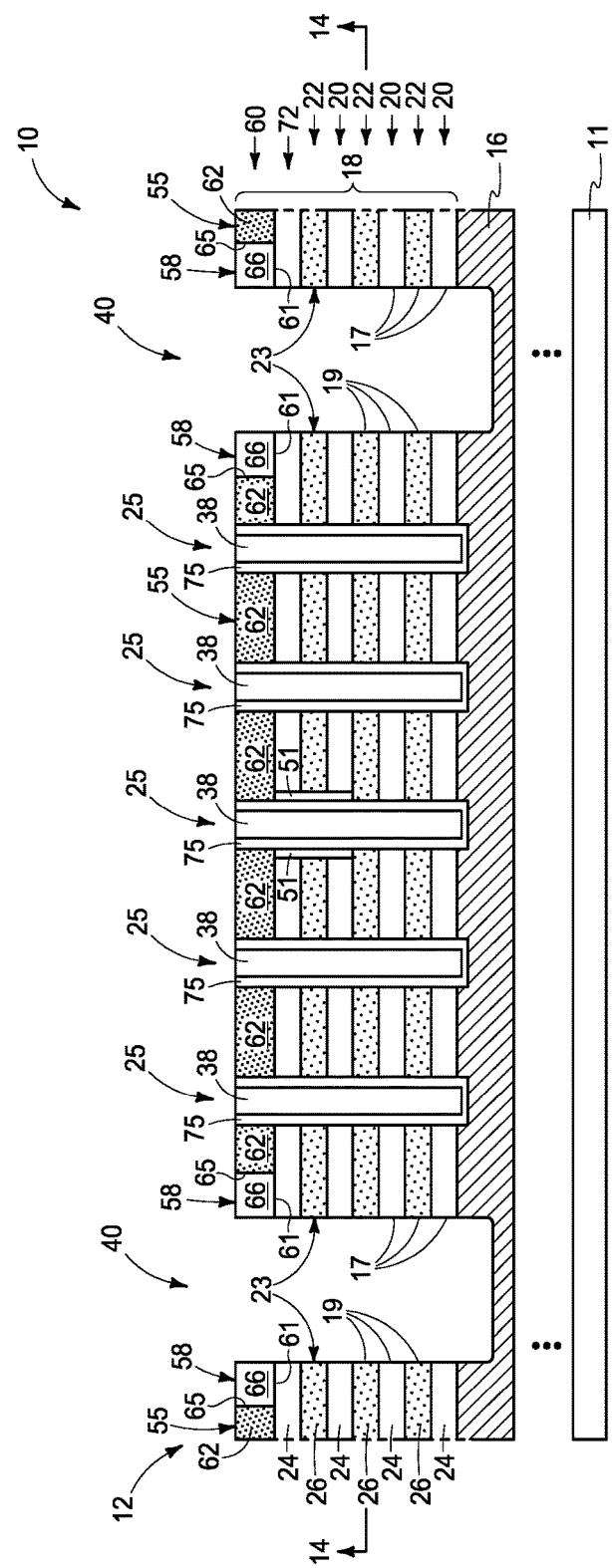

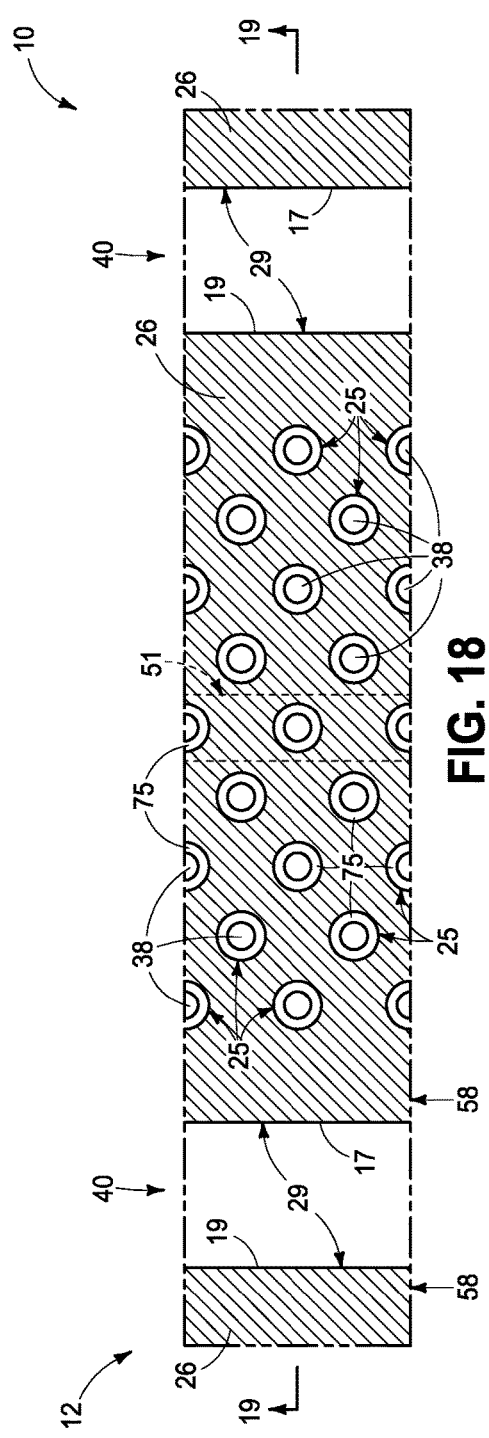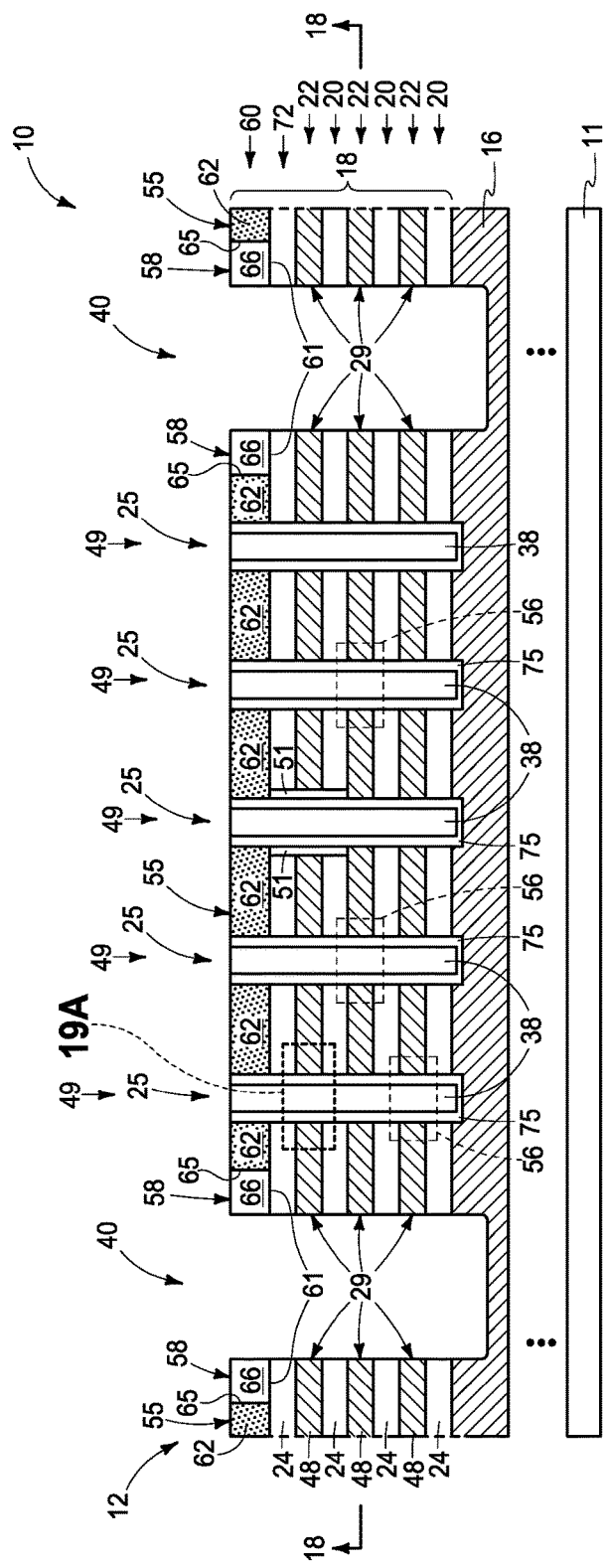

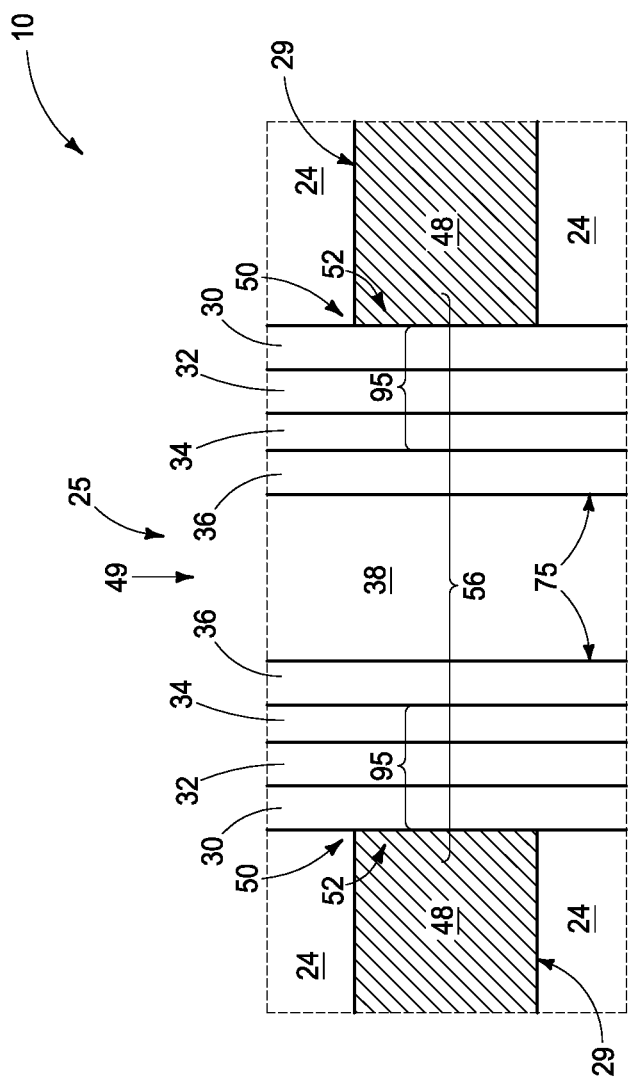

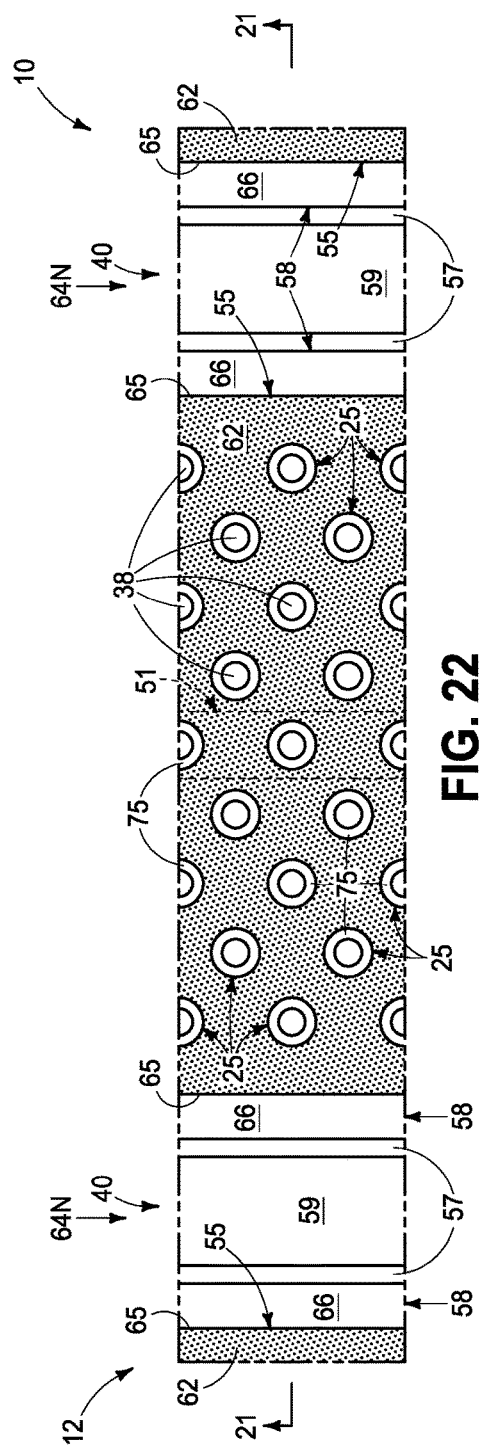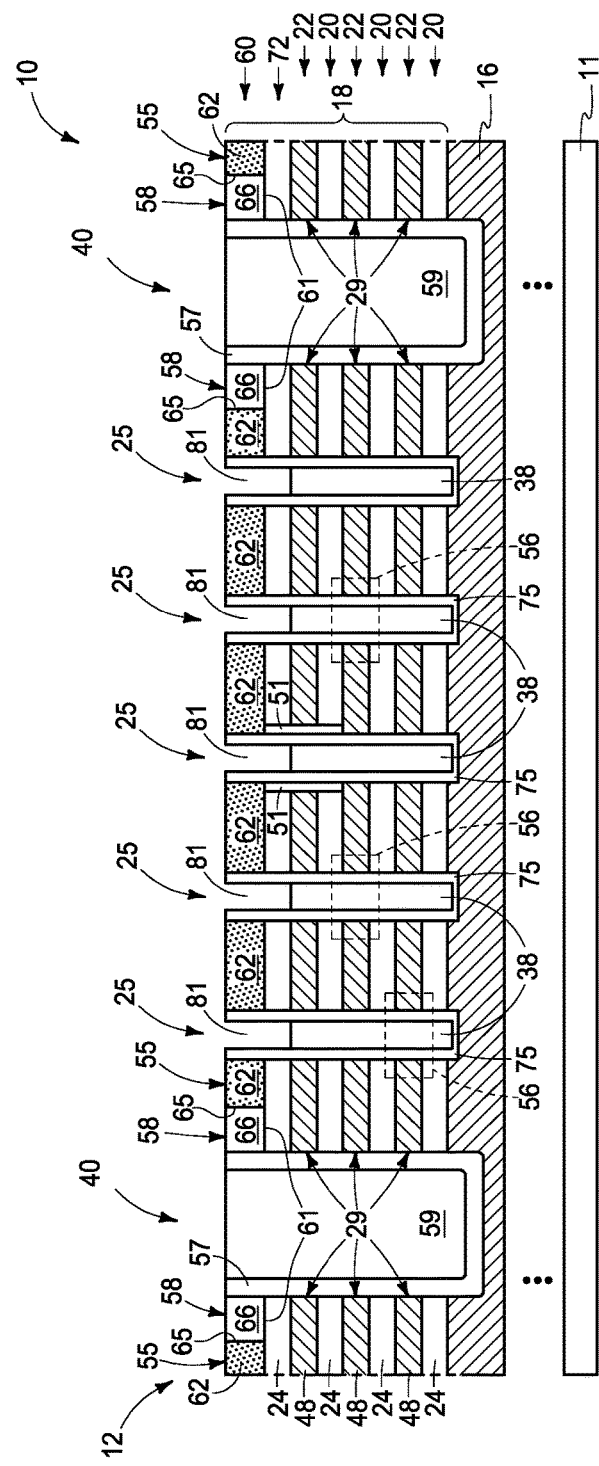

US 11,329,062 B2

MEMORY ARRAYS AND METHODS USED IN FORMING A MEMORY ARRAY

RELATED PATENT DATA

This patent resulted from a provisional application U.S. Patent Application Ser. No. 62/746,728, filed Oct. 17, 2018, entitled "Memory Arrays And Methods Used In Forming A Memory Array", naming Justin B. Dorhout, Erik Byers, Merri L. Carlson, Indra V. Chary, Damir Fazil, John D. Hopkins, Nancy M. Lomeli, Eldon Nelson, Joel D. Peterson, Dimitrios Pavlopoulos, Paolo Tessariol and Lifang Xu as inventors, the disclosure of which is incorporated by reference.

TECHNICAL FIELD

Embodiments disclosed herein pertain to memory arrays and to methods used in forming a memory array.

BACKGROUND

Memory is one type of integrated circuitry and is used in computer systems for storing data. Memory may be fabricated in one or more arrays of individual memory cells. Memory cells may be written to, or read from, using digit lines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a view taken through line 2-2 in FIG. 1.

FIG. 3 is a view of the FIG. 1 substrate at a processing step subsequent to that shown by FIG. 1 and is taken through line 3-3 in FIG. 4.

FIG. 4 is a view taken through line 4-4 in FIG. 3.

FIG. 5 is a view of the FIG. 3 substrate at a processing step subsequent to that shown by FIG. 3 and is taken through line 5-5 in FIG. 6.

FIG. 6 is a view taken through line 6-6 in FIG. 5.

FIG. 6A is an enlarged view of a portion of FIG. 6.

FIG. 6B is an enlarged view of a portion of FIG. 6.

FIG. 9 is a view of a portion of the FIG. 7 substrate laterally displaced from the FIG. 7 view and is taken through line 9-9 in FIG. 10.

FIG. 10 is a view taken through line 10-10 in FIG. 9.

FIG. 14 is a view of the FIG. 12 substrate at a processing step subsequent to that shown by FIG. 12 and is taken through line 14-14 in FIG. 15.

FIG. 15 is a view taken through line 15-15 in FIG. 14.

FIG. 18 is a view of the FIG. 17 substrate at a processing step subsequent to that shown by FIG. 17 and is taken through line 18-18 in FIG. 19.

FIG. 19 is a view taken through line 19-19 in FIG. 18.

FIG. 19A is an enlarged view of a portion of FIG. 19.

FIG. 22 is a view taken through line 22-22 in FIG. 21.

FIG. 23 is a view of the FIG. 20 substrate at a processing step subsequent to that shown by FIG. 202.

DETAILED DESCRIPTION OF EXAMPLE EMBODIMENTS

Figure 7:
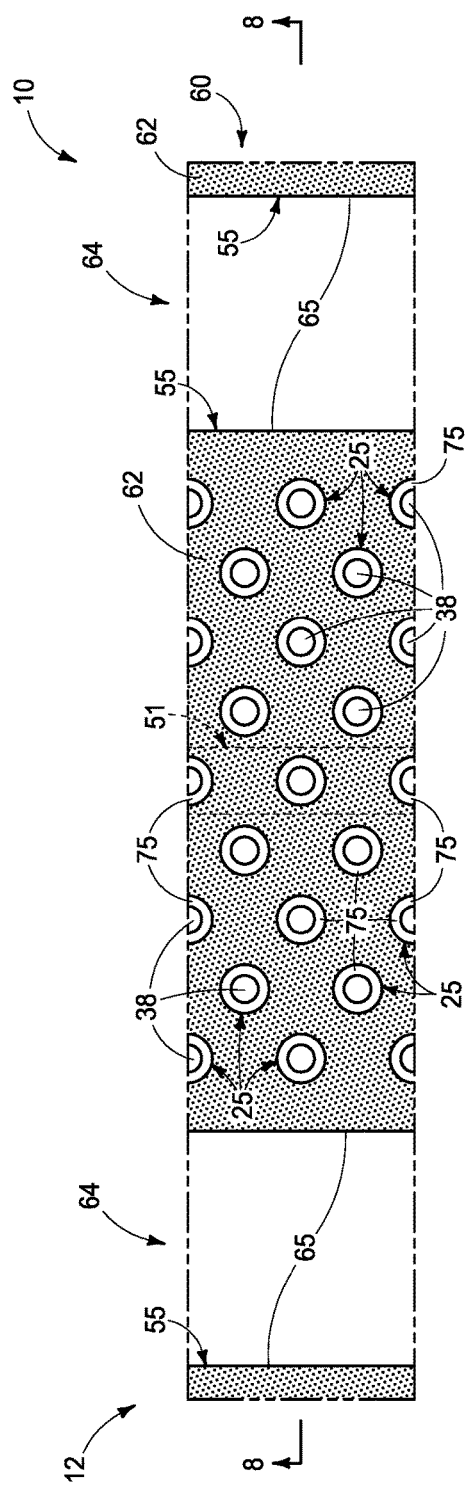
FIG. 7 is a view of the FIG. 5 substrate at a processing step subsequent to that shown by FIG. 5 and is taken through line 7-7 in FIG. 8.

Embodiments of the invention encompass methods used in forming an array of transistors and/or memory cells, for example a memory array of NAND or other memory cells having peripheral control circuitry under the array (e.g., CMOS under-array). Embodiments of the invention encompass so-called "gate-last" or "replacement-gate" processing, so-called "gate-first" processing, and other processing whether existing or future-developed independent of when transistor gates are formed. Embodiments of the invention also encompass an array of transistors and/or a memory array (e.g., comprising NAND or other memory cells) independent of method of manufacture. First example method embodiments are described with reference to FIGS. 1-30 (including FIGS. 6A, 6B, and 19A) which may be considered as a "gate-last" or "replacement-gate" process.

FIGS. 1 and 2 show a substrate construction 10 in process in a method of forming an array 12 of elevationally-extending strings of transistors and/or memory cells (not yet shown). Substrate construction 10 comprises a base substrate 11 having any one or more of conductive/conductor/conducting (i.e., electrically herein), semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

Substrate construction 10 comprises a stack 18 comprising vertically-alternating insulative tiers 20 and wordline tiers 22 directly above an example conductively-doped semiconductor material 16 (e.g., conductively-doped polysilicon above metal material). Wordline tiers 22 may not comprise conductive material and insulative tiers 20 may not comprise insulative material or be insulative at this point in processing. Only a small number of tiers 20 and 22 is shown, with more likely stack 18 comprising dozens, a hundred or more, etc. of tiers 20 and 22. Wordline tiers 22 comprise first material 26 (e.g., silicon nitride) which may be wholly or partially sacrificial. Insulative tiers 20 comprise second material 24 (e.g., silicon dioxide) that is of different composition from that of first material 26 and which may be wholly or partially sacrificial. In one embodiment, material 26 may be considered as first sacrificial material 26 and in one embodiment material 24 may be considered as second sacrificial material 24. Conductive material 16 may comprise part of control circuitry (e.g., peripheral-under-array circuitry) used to control read and write access to the transistors and/or memory cells that will be formed within array 12. Other circuitry that may or may not be part of peripheral and/or control circuitry (not shown) may be between conductive material 16 and stack 18. For example, multiple vertically-alternating tiers of conductive material and insulative material (not shown) of such circuitry may be below a lowest of the wordline tiers 22 and/or above an uppermost of the wordline tiers 22.

Stack 18 comprises an insulator tier 60 above wordline tiers 22. In one embodiment and as shown, stack 18 comprises a dielectric tier 72 (e.g., comprising silicon dioxide or other dielectric material) vertically between insulator tier 60 and uppermost wordline tier 22. Insulator tier 60 comprises insulator material 62 (in some embodiments referred to as first insulator material 62) comprising silicon, nitrogen and one or more of carbon, oxygen, boron, and phosphorus. In one embodiment, first insulator material 62 comprises one and only one of carbon, oxygen, boron, or phosphorus. In another embodiment, first insulator material 62 comprises at least two of carbon, oxygen, boron, and phosphorus. In one embodiment, the one or more of carbon, oxygen, boron, and phosphorous in first insulator material 62 has a total concentration of at least about 2 atomic percent, and in one such embodiment such total concentration is no more than about 20 atomic percent. In one embodiment, such total concentration is at least about 4 atomic percent, and in one embodiment is at least about 10 atomic percent. In one embodiment, such total concentration is from about 6 atomic percent to about 11 atomic percent. In one embodiment, insulative tiers 20 comprise insulative material (e.g., 24), with first insulator material 62 being of different composition from that of the insulative material of all insulative tiers 20. An optional insulator material line 51 (e.g., silicon dioxide) has been provided in stack 18 prior to forming first insulator material 62. Such may be used for bifurcating a select gate drain control line that is in an upper conductive tier in stack 18 into two controllable gates. (See, for example, un-bifurcated select gate drain control lines as shown in U.S. Patent Application Publication No. 2017/0140833 to Caillat et al. published on May 18, 2017, and which is hereby and herein fully incorporated by reference).

Referring to FIGS. 3 and 4, channel openings 25 have been formed (e.g., by dry anisotropic etching) into insulator tier 60, dielectric tier 72, wordline tiers 22, and insulative tiers 20. By way of example only, channel openings 25 are shown as being arranged in groups or columns of staggered rows of four openings 25 per row alternating with five openings per row. Any alternate existing or future-developed arrangement and construction may be used. Channel openings 25 may go into conductive material 16 as shown or may stop there-atop (not shown).

In one embodiment, transistor channel material is formed in the individual channel openings to extend elevationally through the insulative tiers and the wordline tiers, and individual memory cells of the array are formed to comprise a gate region (e.g., a control-gate region) and a memory structure laterally between the gate region and the channel material. In one such embodiment, the memory structure is formed to comprise a charge-blocking region, charge-storage material, and insulative charge-passage material. The charge-storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a bandgap-engineered structure having nitrogen containing material [e.g., silicon nitride] sandwiched between two insulator oxides [e.g., silicon dioxide]) is laterally between the channel material and the charge-storage material.

FIGS. 5, 6, 6A, and 6B show a material 75 having been deposited to line channel openings 25 and fill material 38 having been formed radially inward thereof. Enlarged FIGS. 6A and 6B show an example composition of material 75 wherein, in one embodiment, charge-blocking material 30, charge-storage material 32, and charge-passage material 34 have been formed in individual channel openings 25, with in one embodiment material 75 having been deposited elevationally along tiers 60, 72, 22, and 20. Transistor materials 30, 32 and 34 (e.g., memory cell materials) may be formed by, for example, deposition of respective thin layers thereof over stack 18 and within individual channel openings 25 followed by planarizing such back at least to an uppermost surface of stack 18. Punch etching may be conducted to remove materials 30, 32, and 34 from the bases of channel openings 25 to expose conductive material 16. Channel material 36 has then been formed in channel openings 25 elevationally along tiers 60, 72, 22, and 20. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 are 25 to 100 Angstroms. Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown).

Figure 8:
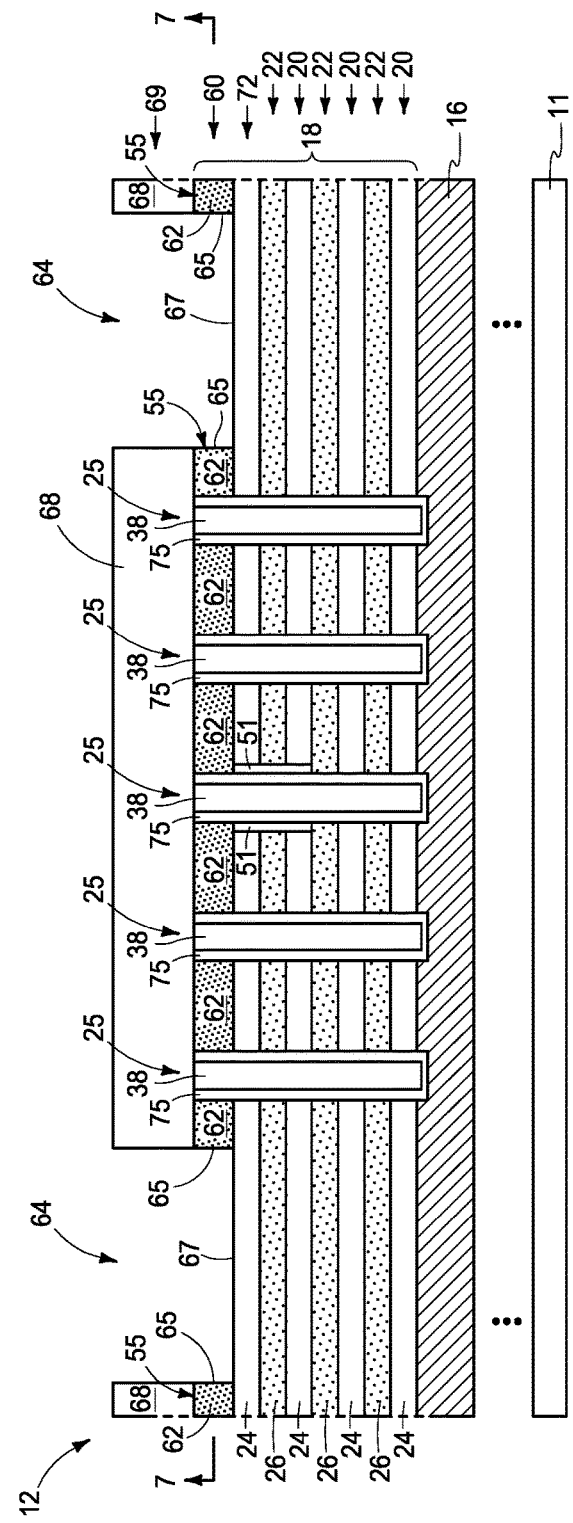
FIG. 8 is a view taken through line 8-8 in FIG. 7.

The first insulator material is patterned to form first horizontally-elongated trenches in the insulator tier which, in one embodiment, extend elevationally through the first insulator material. Any existing or future-developed technique(s) may be used. As one example, FIGS. 7 and 8 show formation of a patterned masking layer 68 atop stack 18, thereby forming a mask 69. Such may be patterned, for example, by blanket deposition of masking layer 68 followed by mask-patterning thereof (e.g., using photolithographic patterning and etch). By way of example, masking layer 68 may comprise one or more of photoresist, polyimide, hard-masking materials, anti-reflective coatings, etc. FIGS. 7 and 8 show patterned masking layer 68 as having been used as a mask 69 while etching first insulator material 62 to form first horizontally-elongated trenches 64 in insulator tier 60.

In one embodiment, and as shown in FIGS. 9 and 10, construction 10 comprises a staircase region 70 that is adjacent memory array 12 and where electrical contact will be made to wordline tiers 22. Insulator tier 60 has been formed across staircase region 70 and patterned masking layer 68 has been formed there-atop in staircase region 70 to comprise mask 69. Masking layer 68 may be patterned in any shape or configuration in staircase region 70 and for any purpose. FIG. 10 shows insulator tier 60 in staircase region 70 having been etched using patterned masking layer 68 therein as a mask 69 during the etching of first insulator material 62 to form first horizontally-elongated trenches 64 in insulator tier 60 in memory array 12. Accordingly, and in one embodiment, the patterning of first insulator material 62 to form horizontally-elongated trenches 64 in insulator tier 60 is combined with another masking step whereby no separate patterning step is used in the formation of first horizontally-elongated trenches 64 (e.g., a prior art dedicated staircase masking step of FIGS. 9 and 10 is expanded to include the processing of FIGS. 7 and 8 to avoid adding a separate dedicated masking step therefor).

First horizontally-elongated trenches 64 may be formed before (not shown) forming channel openings 25 and channel material therein or there-after (as shown). Regardless, in some embodiments and as shown, the patterning of first insulator material 62 to form first trenches 64 forms lines 55 of first insulator material 62, with only one complete line 55 being shown from side-to-side in FIGS. 7 and 8, and with only one edge of two immediately laterally-adjacent lines 55. First trenches may be considered as comprising sidewalls 65 which in one embodiment comprise first insulator material 62 and bases 67.

Figure 11:
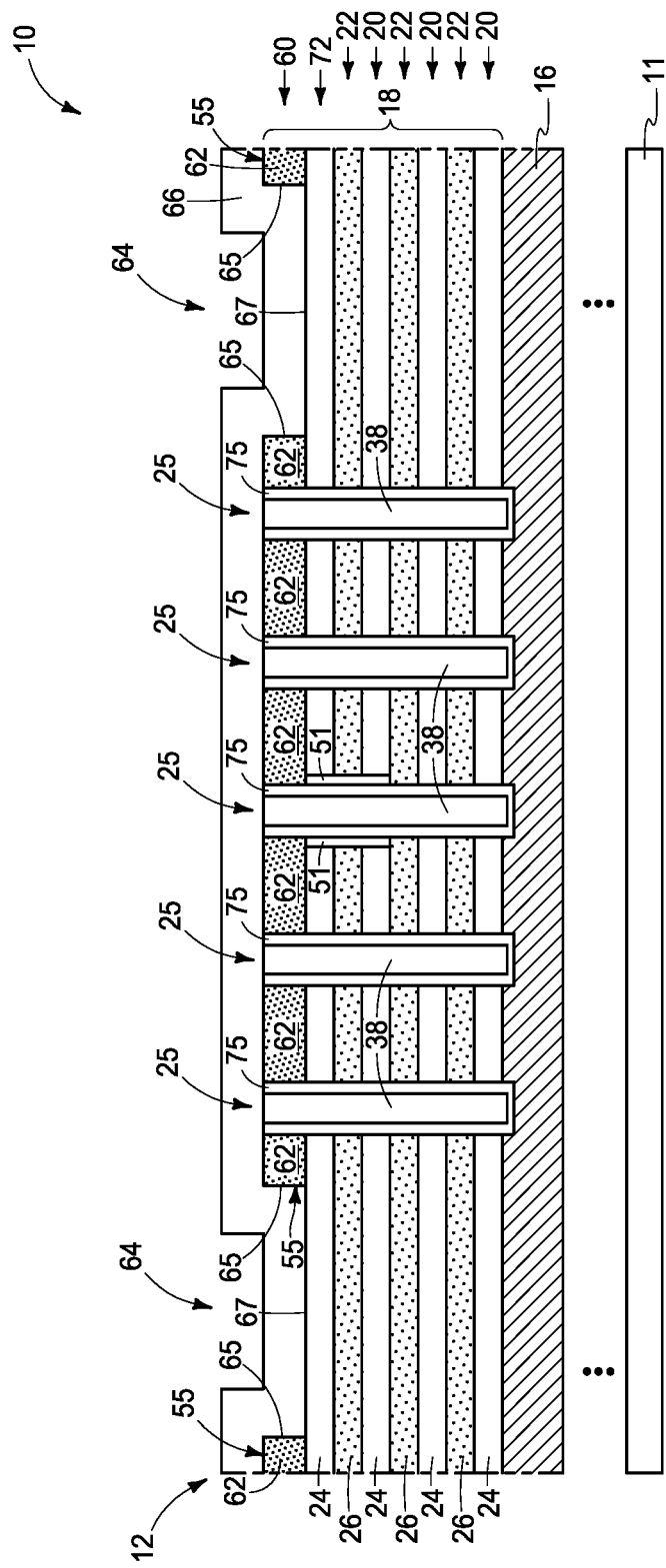
FIG. 11 is a view of the FIG. 8 substrate at a processing step subsequent to that shown by FIG. 8.
Figure 12:
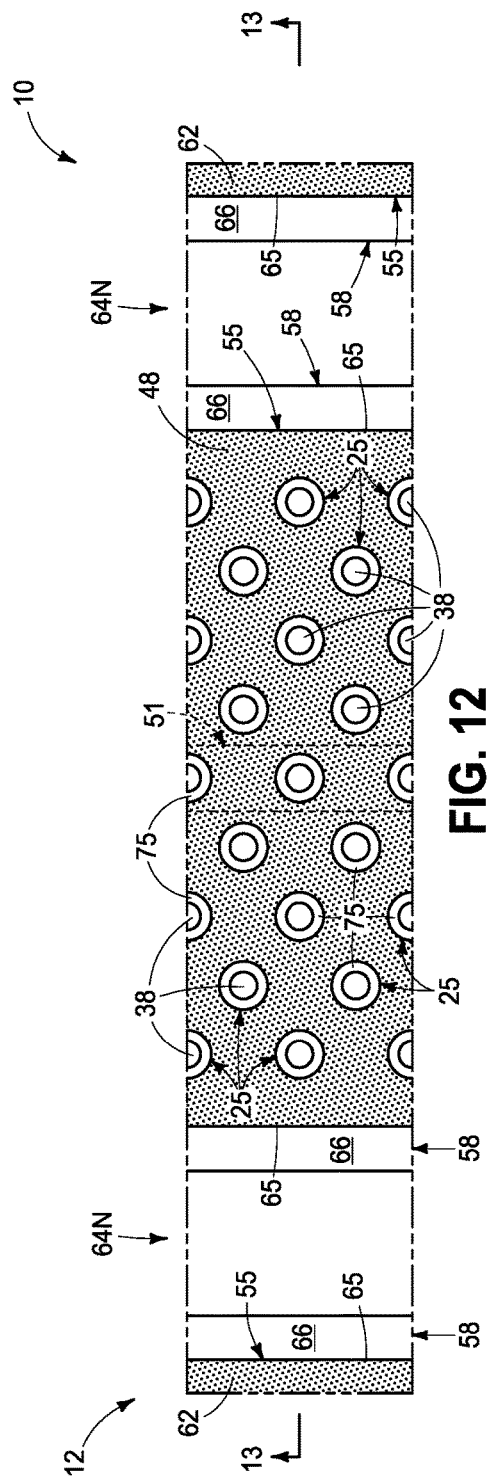
FIG. 12 is a view of the FIG. 11 substrate at a processing step subsequent to that shown by FIG. 11 and is taken through line 12-12 in FIG. 13.
Figure 13:
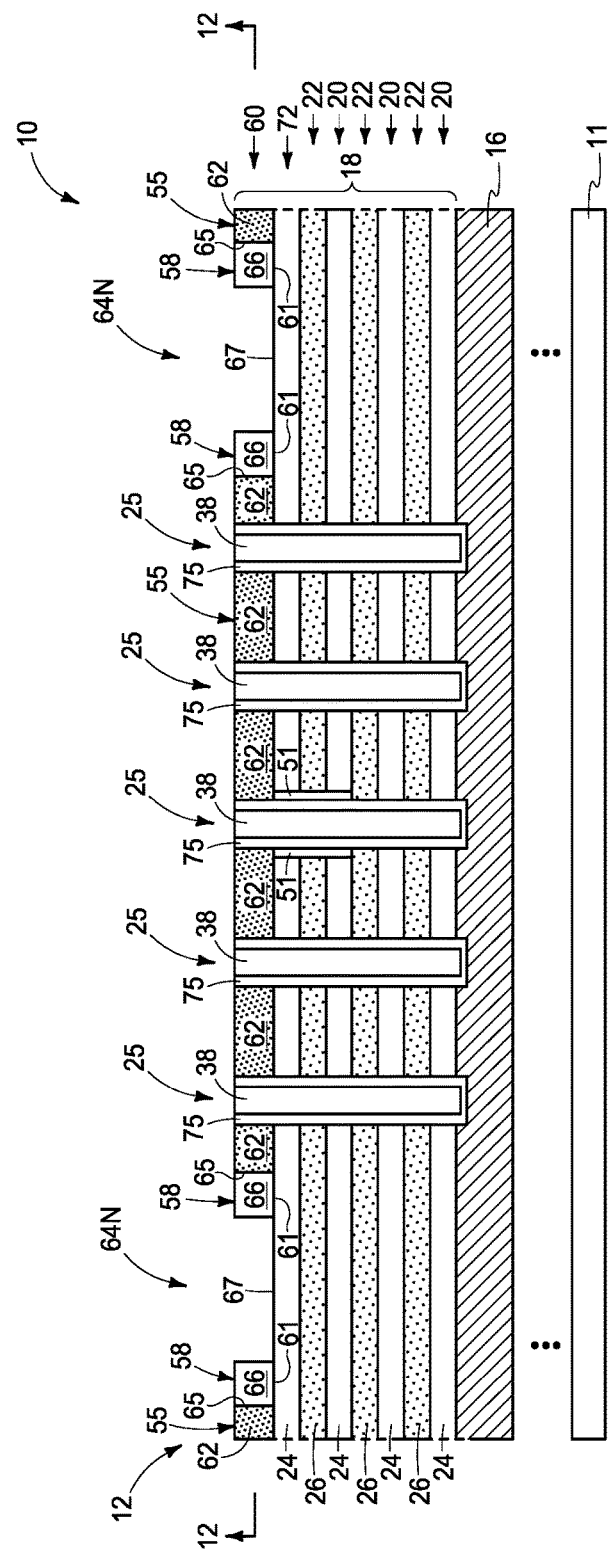
FIG. 13 is a view taken through line 13-13 in FIG. 12.

Second insulator material, and that is of different composition from that of the first insulator material, is formed in the first trenches along sidewalls of the first insulator material and narrows the first trenches. Such may occur by any existing or future-developed manner, with one example technique that may not use a masking step being described with reference to FIGS. 11-13. FIG. 11 shows forming of a second insulator material 66 (e.g., silicon dioxide) atop first insulator material 62, along sidewalls 65 of first insulator material 62, and directly above bases 67 of first trenches 64 (and after masking layer 68 [not shown] has been removed). FIGS. 12 and 13 show maskless anisotropic etching of second insulator material 66 to remove such from being directly above first-trench bases 67 except where it is immediately adjacent first-trench sidewalls 65 and to remove such from being atop first insulator material 62. In one embodiment and as shown, second insulator material 66 has been formed to comprise lines 58 thereof that are along sidewalls 65 of first-insulator-material lines 55 and has resulted in narrowing first trenches 64 which are now designated as 64N. Second-insulator-material-lines 58 may be considered as having individual bases 61.

Referring to FIGS. 14 and 15, second horizontally-elongated trenches 40 have been formed into stack 18 through insulative tiers 20 and wordline tiers 22 (and dielectric tier 72 when present) and in one embodiment to conductive material 16 (at least to material 16). Second trenches 40 are horizontally along narrowed first trenches 64N laterally between and below second insulator material 66. Such may be formed by any existing or future-developed technique, for example photolithographic patterning and etching analogous to that described above in patterning first insulator material 62 to form first trenches 64 in insulator tier 60. Regardless, forming of trenches 40 has formed insulative tiers 20 and wordline tiers 22 to comprise opposing longitudinal edges 17, 19 (e.g., pairs of such edges) that comprise longitudinal outline shapes 23 of individual wordlines to be formed in individual wordline tiers 22. Only one complete longitudinal outline 23 is shown with respect to two opposing longitudinal edges 17, 19, with only a partial longitudinal outline of two laterally-adjacent wordlines to be formed adjacent longitudinal outline 23 being visible with respect to one longitudinal edge 17 and one longitudinal edge 19. The wordlines to be formed may project laterally outward or be recessed laterally inward relative to longitudinal edges 17 and 19.

Figure 16:
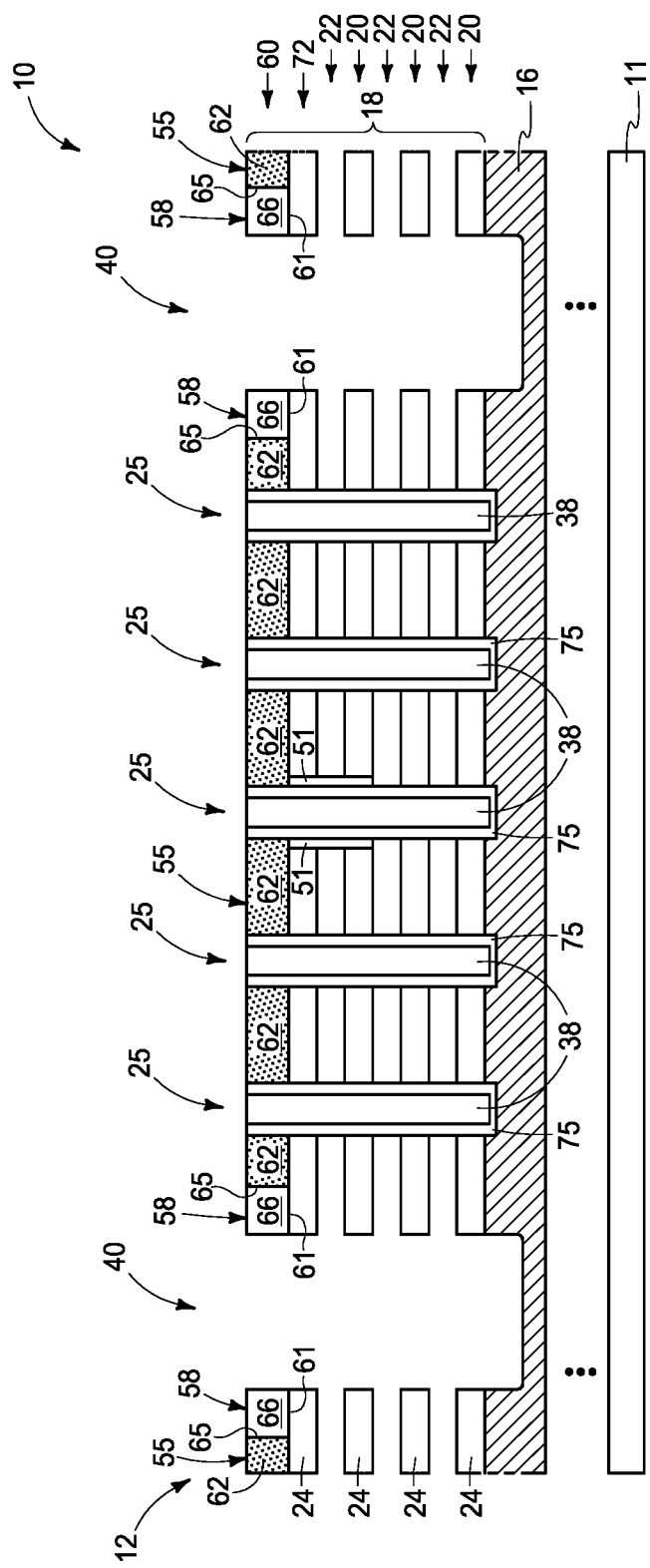
FIG. 16 is a view of the FIG. 15 substrate at a processing step subsequent to that shown by FIG. 15.

Referring to FIG. 16, first material 26 (not shown) of wordline tiers 22 has been etched selectively relative to second material 24. Ideally, and in one embodiment, such etching is also conducted selectively relative to first insulator material 62, with lines 58 thereof protecting first insulator material 62 from being laterally etched while removing first material 26. Some first insulator material 62 may be somewhat etched downwardly (not shown). An example etching technique where materials 24 and 62 are silicon dioxide and material 26 is silicon nitride is using liquid or vapor $H_3PO_4$ as a primary etchant.

Figure 17:
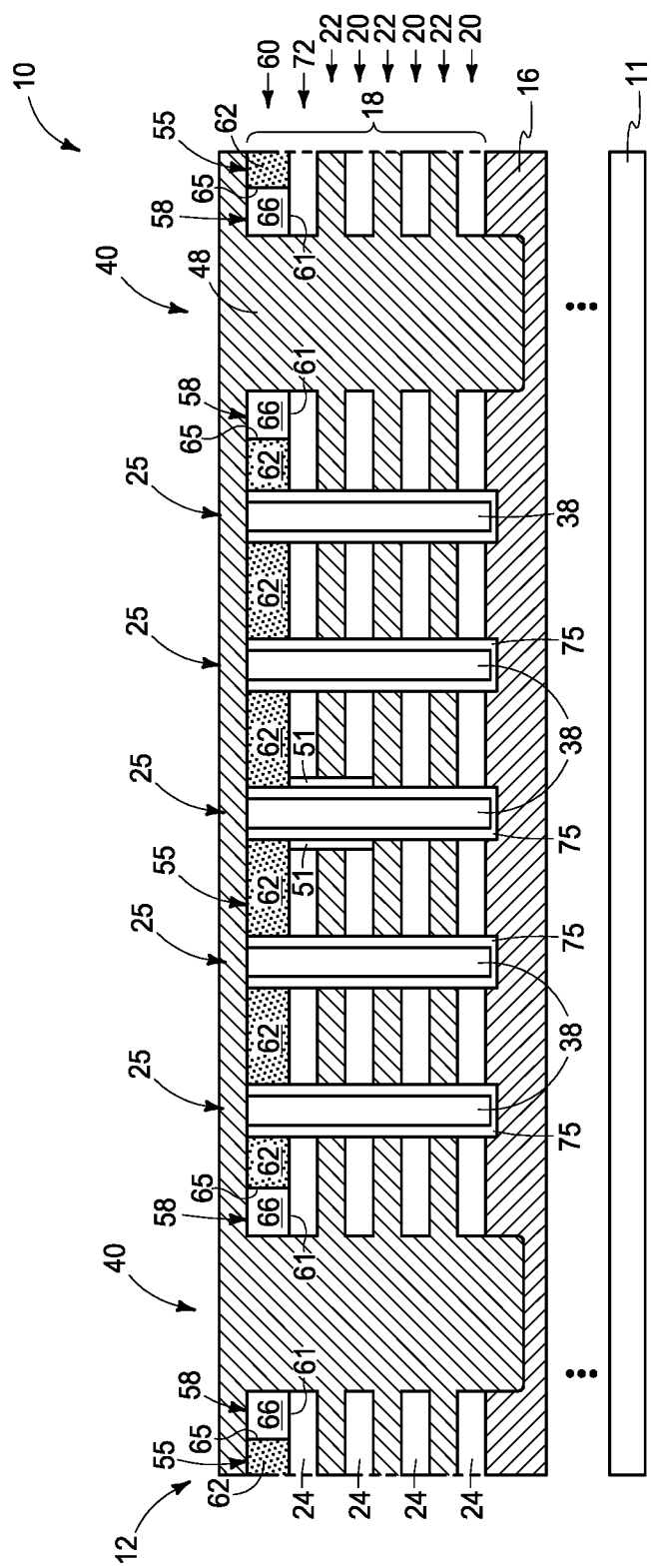
FIG. 17 is a view of the FIG. 16 substrate at a processing step subsequent to that shown by FIG. 16.

Referring to FIG. 17, conductive material 48 has been formed into wordline tiers 22 through trenches 40 and which will comprise conductive material of the individual wordlines being formed. Any suitable conductive material may be used, for example one or both of metal material and/or conductively-doped semiconductor material.

Referring to FIGS. 18, 19, and 19A, conductive material 48 has been removed from individual trenches 40. Such has resulted in formation of wordlines 29 and elevationally-extending strings 49 of individual transistors and/or memory cells 56. Approximate locations of a transistor and/or memory cell 56 is indicated with a bracket in FIG. 19A and some with dashed outlines in FIGS. 18 and 19, with transistors and/or memory cells 56 being essentially ring-like or annular in the depicted example. Conductive material 48 may be considered as having terminal ends 50 (FIG. 19A) corresponding to control-gate regions 52 of individual transistors and/or memory cells 56. Control-gate regions 52 in the depicted embodiment comprise individual portions of individual wordlines 29. Materials 30, 32, and 34 may be considered as a memory structure 95 that is laterally between control-gate region 52 and channel material 36.

A charge-blocking region (e.g., charge-blocking material 30) is between charge-storage material 32 and individual control-gate regions 52. A charge block may have the following functions in a memory cell: In a program mode, the charge block may prevent charge carriers from passing out of the charge-storage material (e.g., floating-gate material, charge-trapping material, etc.) toward the control gate, and in an erase mode the charge block may prevent charge carriers from flowing into the charge-storage material from the control gate. Accordingly, a charge block may function to block charge migration between the control-gate region and the charge-storage material of individual memory cells. An example charge-blocking region as shown comprises insulator material 30. By way of further examples, a charge-blocking region may comprise a laterally (e.g., radially) outer portion of the charge-storage material (e.g., material 32) where such charge-storage material is insulative (e.g., in the absence of any different-composition material between an insulative charge-storage material 32 and conductive material 48). Regardless, as an additional example, an interface of a charge-storage material and conductive material of a control gate may be sufficient to function as a charge-blocking region in the absence of any separate-composition-insulator material 30. Further, an interface of conductive material 48 with material 30 (when present) in combination with insulator material 30 may together function as a charge-blocking region, and as alternately or additionally may a laterally-outer region of an insulative charge-storage material (e.g., a silicon nitride material 32). An example material 30 is any of silicon hafnium oxide, silicon dioxide, and/or silicon nitride.

Figure 20:
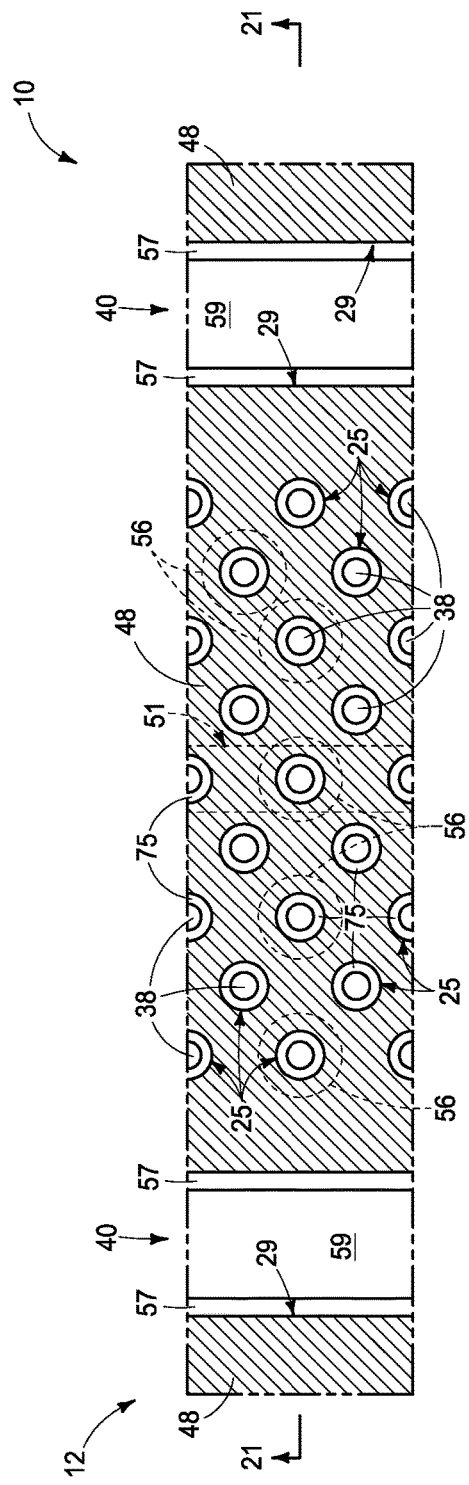
FIG. 20 is a view of the FIG. 18 substrate at a processing step subsequent to that shown by FIG. 18 and is taken through line 20-20 in FIG. 21.
Figure 21:
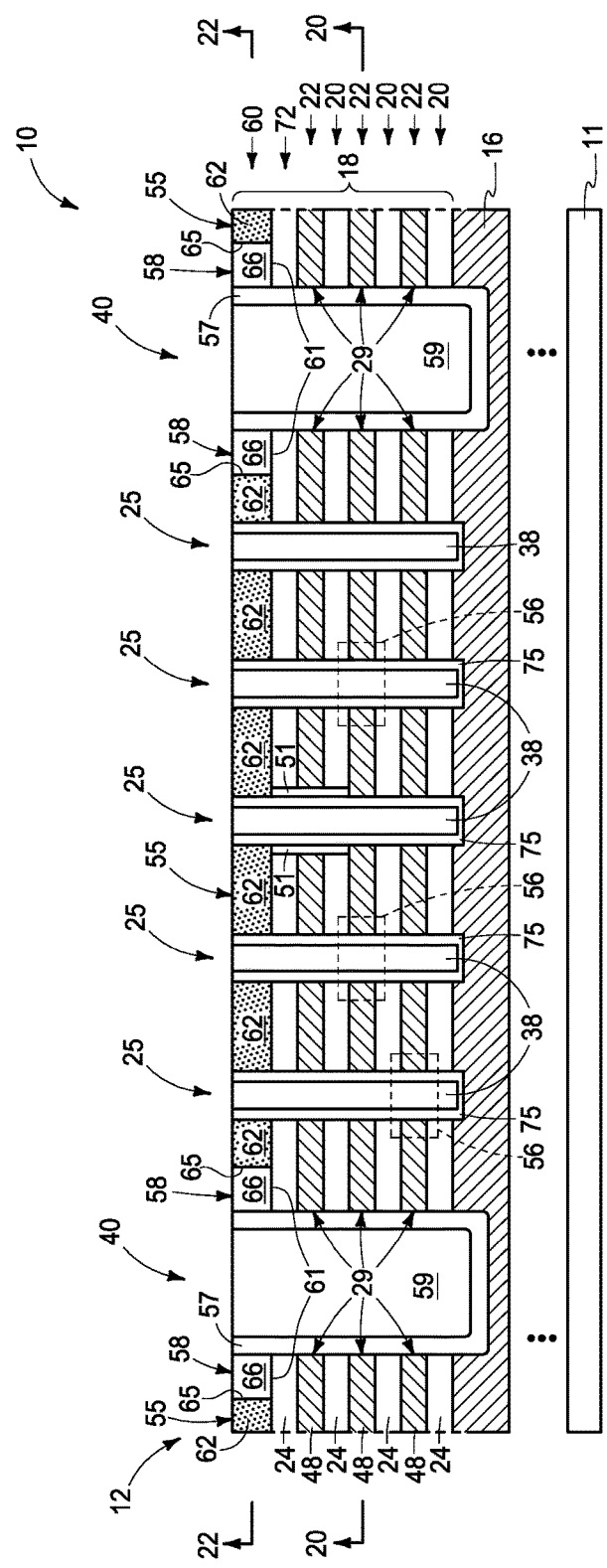
FIG. 21 is a view taken through line 21-21 in FIGS. 20 and 22.

Referring to FIGS. 20-22, another material (e.g., 57 [dielectric, such as silicon dioxide or silicon nitride] and e.g., 59 [polysilicon]) has been formed in individual trenches 40.

Figure 24:
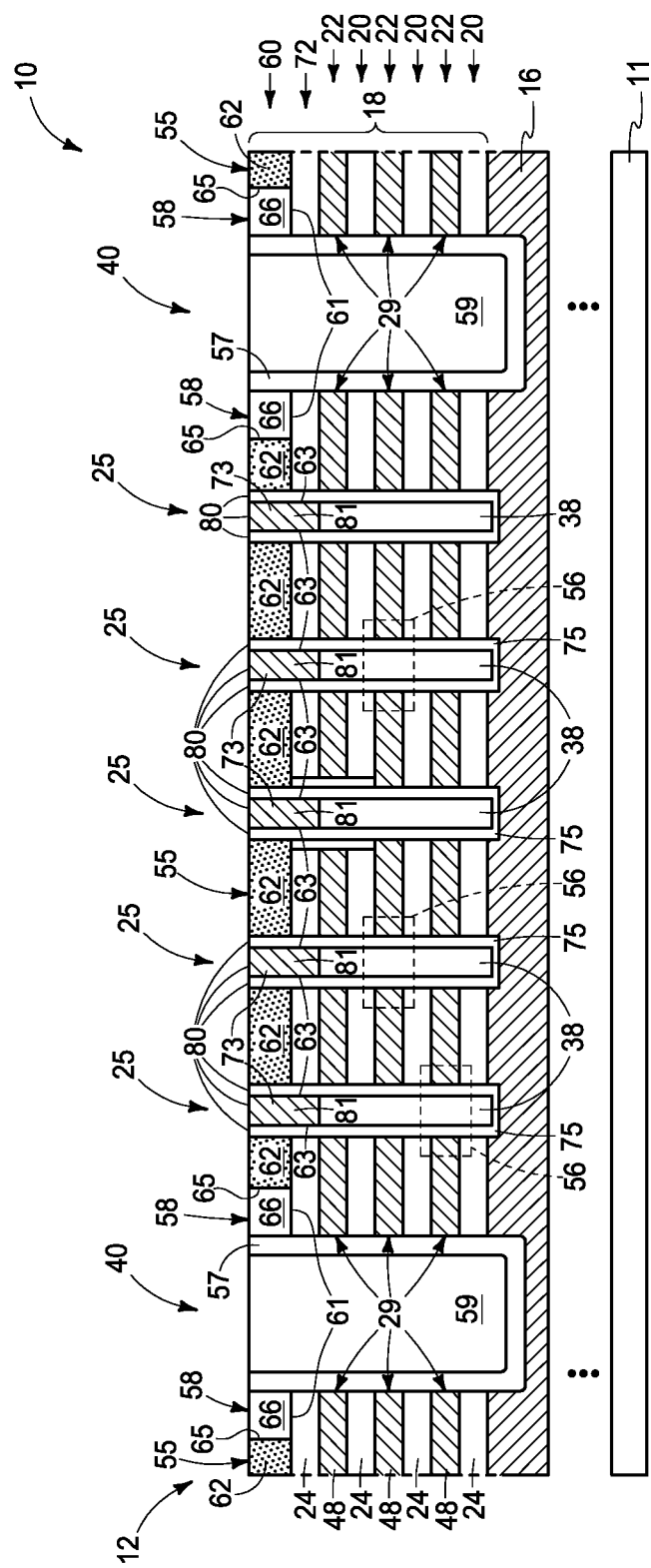
FIG. 24 is a view of the FIG. 23 substrate at a processing step subsequent to that shown by FIG. 23.

Conductive vias are formed that individually electrically couple, in one embodiment directly electrically couple, to individual strings of channel material 36 in memory cell strings 49. For example, and referring to FIG. 23, material 38 within channel openings 25 has been recessed back (e.g., by a timed selective etch of material 38 relative to other exposed materials), forming void spaces 81. FIG. 24 shows subsequent filling of void spaces 81 with conductive material, and planarizing such back, to form conductive vias 73, which in some embodiments are referred to as first conductive vias 73. In one embodiment and as shown, first conductive vias 73 extend elevationally through insulator tier 60. In one embodiment and as shown, channel material 36 is along and directly against sidewalls 63 of first conductive vias 73, and in one such embodiment channel material 36 and conductive vias 73 have elevationally coincident top surfaces 80.

Figure 25:
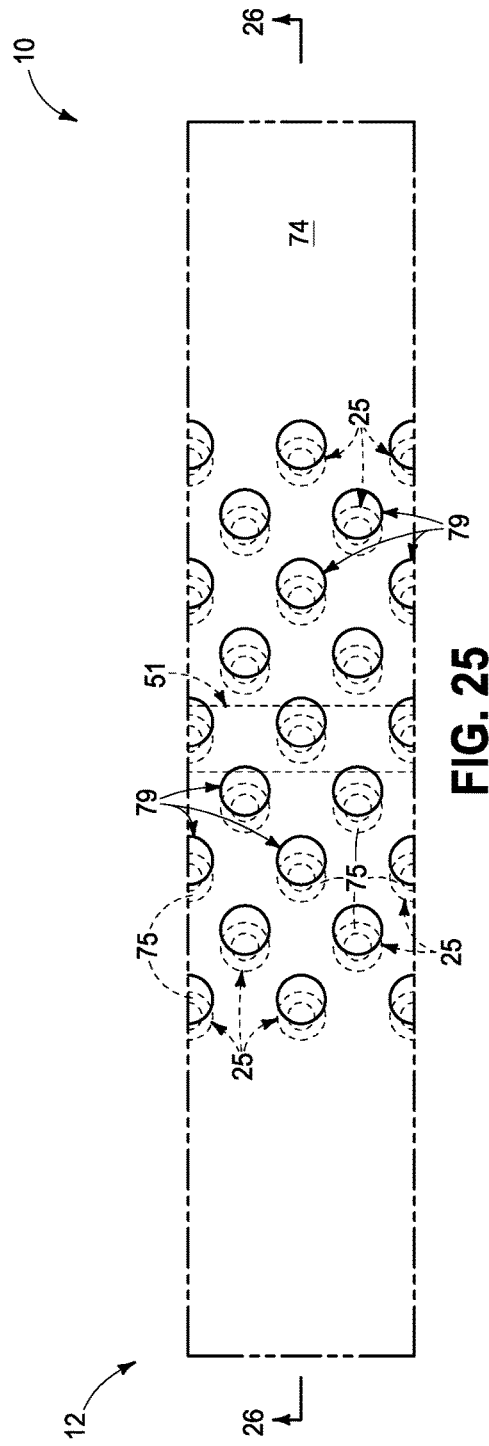
FIG. 25 is a view of the FIG. 24 substrate at a processing step subsequent to that shown by FIG. 24 and is taken through line 25-25 in FIG. 26.
Figure 26:
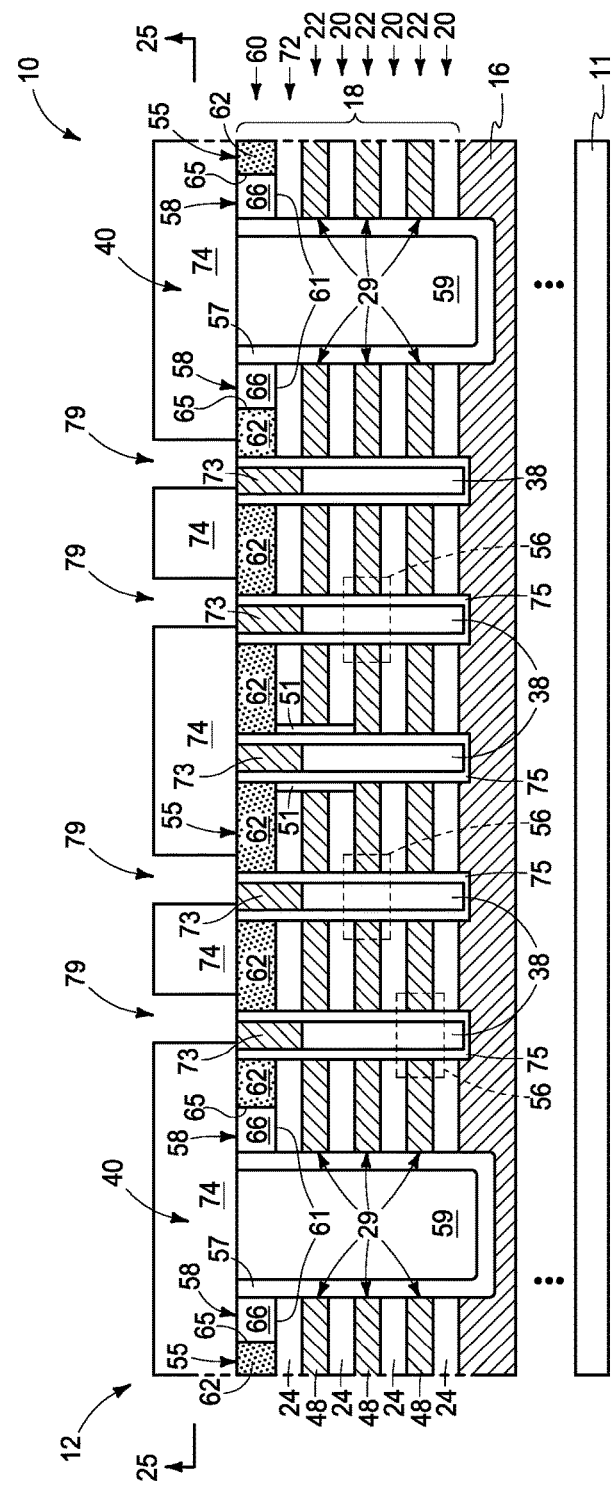
FIG. 26 is a view taken through line 26-26 in FIG. 25.
Figure 27:
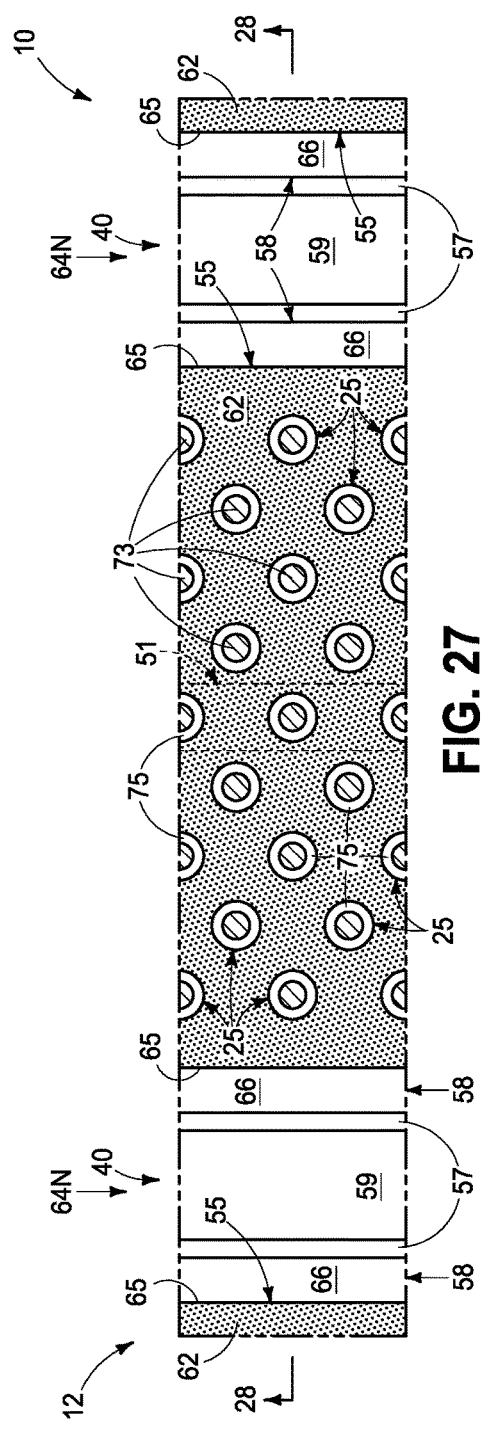
FIG. 27 is a view of the FIG. 25 substrate at a processing step subsequent to that shown by FIG. 25 and is taken through line 27-27 in FIG. 28.
Figure 28:
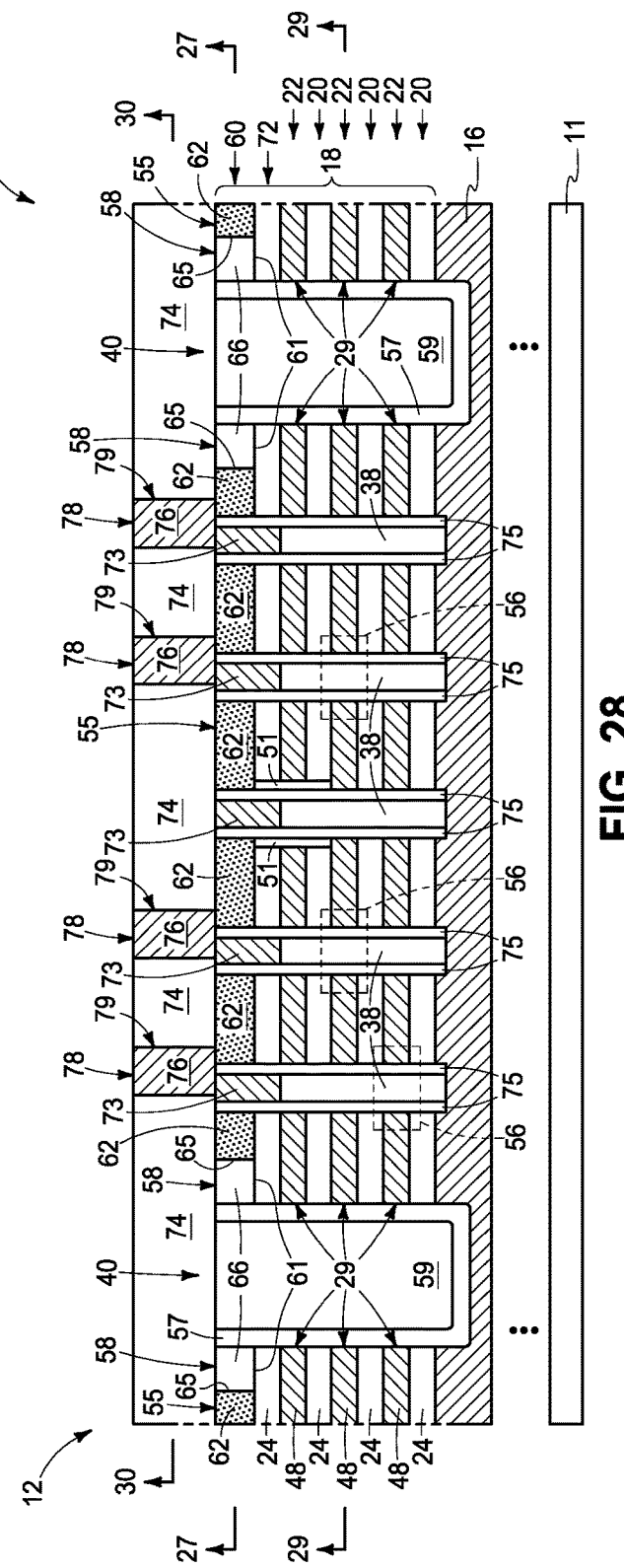
FIG. 28 is a view taken through line 28-28 in FIGS. 27, 29, and 30.
Figure 29:
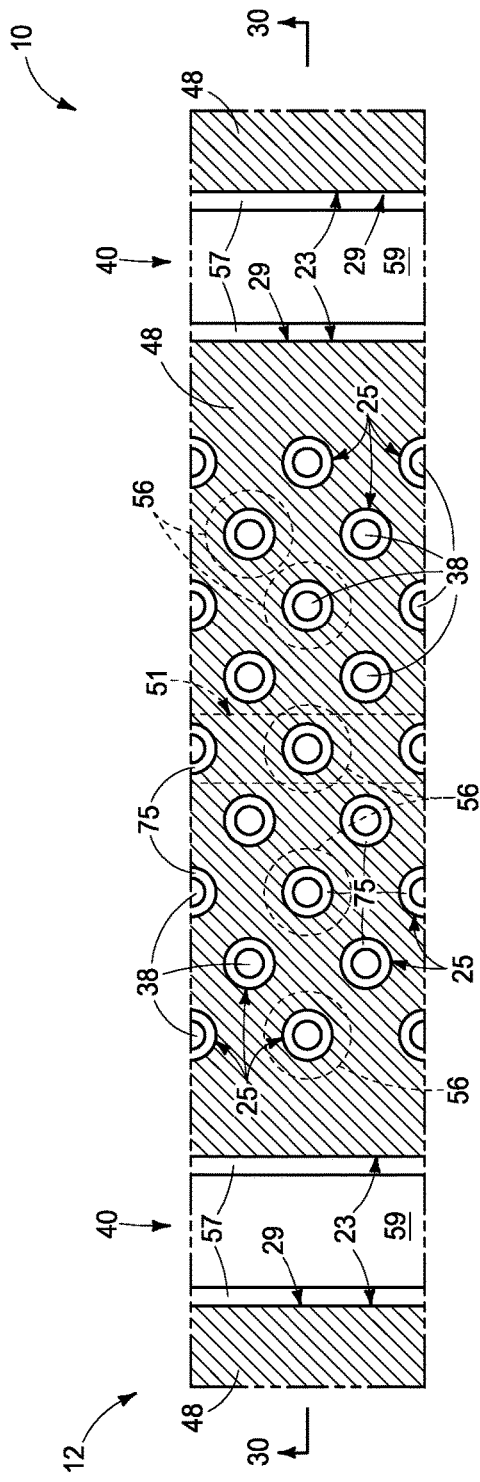
FIG. 29 is a view taken through line 29-29 in FIG. 28.
Figure 30:
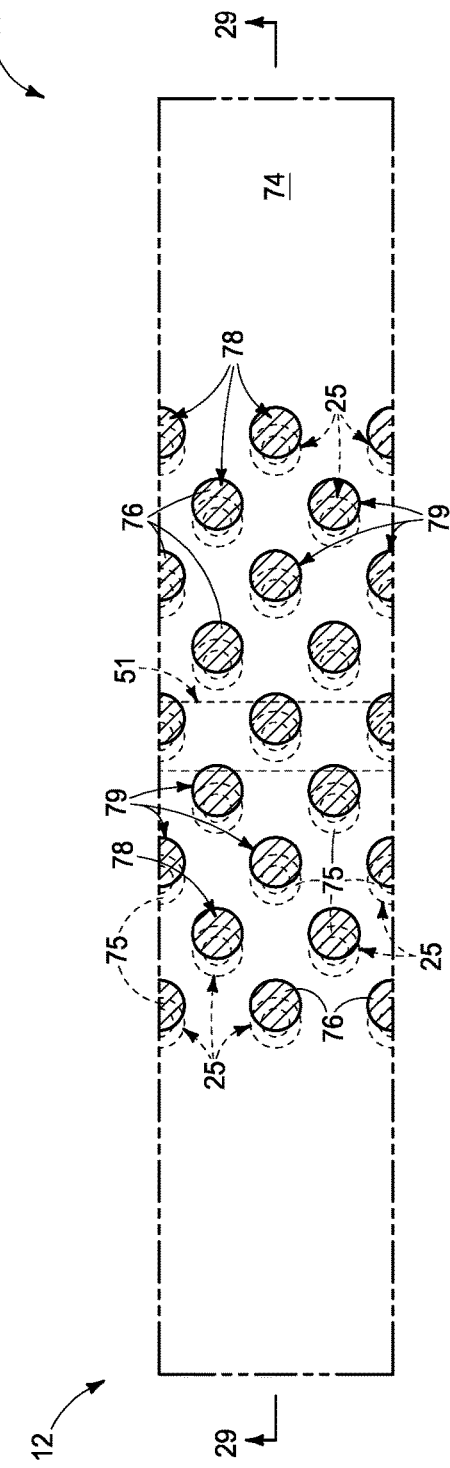
FIG. 30 is a view taken through line 30-30 in FIG. 28.

Referring to FIGS. 25 and 26, insulative material 74 (e.g., silicon dioxide and/or silicon nitride) has been formed above first conductive vias 73 and is of different composition from that of first insulator material 62. Individual openings 79 have been etched through insulative material 74 (e.g., using photolithography) to individual first conductive vias 73. At least some (all as shown) of individual openings 79 extend laterally outward beyond an uppermost perimeter of the respective individual first conductive vias 73 there-below, with such openings 79 in one embodiment extending to first insulator material 62. Such may occur, for example, by undesirable x-direction and/or y-direction misalignment of a mask (not shown) used to form openings 79. In one embodiment, first insulator material 62 is used as an etch stop while etching openings 79 to preclude such individual openings 79 from being etched through first insulator material 62 to conducting material (e.g., 48) there-below. Openings 48 are shown as stopping on uppermost surfaces of first insulator material 62, although some etching into material 62 may occur.

Referring to FIGS. 27-30, conductive material 76 is formed in individual openings 79 to form second conductive vias 78 that are directly electrically coupled to first conductive vias 73. Such conductive material in the depicted openings is directly above first insulator material 62 where extending laterally outward beyond the uppermost perimeter of the respective individual first conductive via 73 to which the respective individual second conductive via 78 is directly electrically coupled. In one embodiment and as shown, conductive material 76 in such openings 79 is directly against first insulator material 62.

In one embodiment, stack 18 may be considered as having tiers (e.g., 22) comprising conductive material (e.g., 48). An uppermost of such tiers may comprise a wordline tier 22 as shown or may comprise another tier that is not a wordline tier, for example and by way of example only being a drain-side select gate (a select gate drain control line). Regardless, and in one embodiment, stack 18 comprises a dielectric tier (e.g., 72) that is vertically between insulator tier 60 and an uppermost of the tiers comprising conductive material. Regardless, and in one embodiment, individual bases 61 of second-insulator-material-lines 58 are above an uppermost of the tiers comprising conductive material.

Individual memory cells (e.g., 56) of the array are ultimately formed to comprise a gate region (e.g., 52) and a memory structure (e.g., 95) in the wordline tiers laterally between the gate region and the channel material. Such individual memory cells including channel material 36 may be formed at any time during the processing despite the above exemplary ideal embodiment showing channel openings 25 and materials therein being formed in earlier stages of the processing. Further, and again, the above processing shows what is commonly referred to as "gate-last" or "replacement-gate" processing, although, for example, "gate-first" processing may be conducted.

Any other attribute(s) or aspect(s) as shown and/or described herein with respect to other embodiments may be used with respect to the above-described embodiments.

Embodiments of the invention encompass memory arrays independent of method of manufacture. Nevertheless, such memory arrays may have any of the attributes as described herein in method embodiments. Likewise, the above-described method embodiments may incorporate and form any of the attributes described with respect to device embodiments.

In one embodiment, a memory array (e.g., 12) comprises a vertical stack (e.g., 18) comprising alternating insulative tiers (e.g., 20) and wordline tiers (e.g., 22). The wordline tiers comprise gate regions (e.g., 52) of individual memory cells (e.g., 56). The gate regions individually comprise part of a wordline (e.g., 29) in individual of the wordline tiers. The stack comprises an insulator tier (e.g., 60) above the wordline tiers. The insulator tier comprises lines (e.g., 55) of first insulator material (e.g., 62) comprising silicon, nitrogen, and one or more of carbon, oxygen, boron, and phosphorous. The first-insulator-material lines and the wordlines have a common longitudinal outline shape (e.g., 23) relative one another. Individual of first-insulator-material lines are narrower than all of the wordlines directly there-below. Second insulator material (e.g., 66) is laterally over sidewalls (e.g., 65) of the first-insulator-material lines. The second insulator material is of different composition from that of the first insulator material. Elevationally-extending strings (e.g., 49) of the memory cells are in the stack. Any other attribute(s) or aspect(s) as shown and/or described herein with respect to other embodiments may be used.

In one embodiment, a memory array (e.g., 12) comprises a vertical stack (e.g., 18) comprising alternating insulative tiers (e.g., 20) and wordline tiers (e.g., 22). The wordline tiers comprise gate regions (e.g., 52) of individual memory cells (e.g., 56). The gate regions individually comprise part of a wordline (e.g., 29) in individual of the wordline tiers. The stack comprises an insulator tier (e.g., 60) above the wordline tiers. The insulator tier comprises lines (e.g., 55) of first insulator material (e.g., 62) comprising silicon, nitrogen, and one or more of carbon, oxygen, boron, and phosphorus. Lines (e.g., 58) of second insulator material (e.g., 66) are along sidewalls (e.g., 65) of the first-insulator-material lines. The second insulator material is of different composition from that of the first insulator material. The second-insulator-material lines have individual bases (e.g., 61) that are above an uppermost of the wordline tiers. Elevationally-extending strings (e.g., 49) of the memory cells are in the stack.

Any other attribute(s) or aspect(s) as shown and/or described herein with respect to other embodiments may be used.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector. In some embodiments, any component, feature, and/or region that extends elevationally extends vertically or within 10° of vertical.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a stack comprising vertically-alternating insulative tiers and wordline tiers. The stack comprises an insulator tier above the wordline tiers. The insulator tier comprises first insulator material comprising silicon, nitrogen, and one or more of carbon, oxygen, boron, and phosphorus. The first insulator material is patterned to form first horizontally-elongated trenches in the insulator tier. Second insulator material is formed in the first trenches along sidewalls of the first insulator material. The second insulator material is of different composition from that of the first insulator material and narrows the first trenches. After forming the second insulator material, second horizontally-elongated trenches are formed through the insulative tiers and the wordline tiers. The second trenches are horizontally along the narrowed first trenches laterally between and below the second insulator material. Elevationally-extending strings of memory cells are formed in the stack.

In some embodiments, a method used in forming a memory array comprises forming a stack comprising vertically-alternating insulative tiers and wordline tiers. The stack comprises an insulator tier above the wordline tiers. The insulator tier comprises first insulator material comprising silicon, nitrogen, and one or more of carbon, oxygen, boron, and phosphorus. Channel material is formed to extend elevationally through the insulator tier, the insulative tiers, and the wordline tiers. After forming the channel material, the first insulator material is patterned to form first horizontally-elongated trenches in the insulator tier. Second insulator material is formed in the first trenches along sidewalls of the first insulator material. The second insulator material is of different composition from that of the first insulator material and narrows the first trenches. After forming the second insulator material, second horizontally-elongated trenches are formed through the insulative tiers and the wordline tiers. The second trenches are horizontally along the narrowed first trenches laterally between and below the second insulator material. The second trenches form the wordline tiers to have a longitudinal outline shape of individual wordlines in individual of the wordline tiers. Individual memory cells of the array are formed to comprise a gate region and a memory structure in the wordline tiers laterally between the gate region and the channel material.

In some embodiments, a method used in forming a memory array comprises forming a stack comprising vertically-alternating insulative tiers and wordline tiers. The stack comprises an insulator tier above the wordline tiers. The insulator tier comprises insulator material comprising silicon, nitrogen, and one or more of carbon, oxygen, boron, and phosphorus. Strings of channel material are formed to extend elevationally through the insulator tier, the insulative tiers, and the wordline tiers. First conductive vias are formed that individually electrically couple to individual of the strings of channel material. Insulative material is formed above the first conductive vias. The insulative material is of different composition from that of the insulator material. Individual openings are etched through the insulative material to individual of the first conductive vias. At least some of the individual openings extend laterally outward beyond a perimeter of the respective individual first conductive via there-below and extend to the insulator material. Conductive material is formed in the individual openings to form second conductive vias that are directly electrically coupled to the first conductive vias. The conductive material in the at least some individual openings is directly above the insulator material where extending laterally outward beyond the perimeter of the respective individual first conductive via to which the respective individual second conductive via is directly electrically coupled.

In some embodiments, a memory array comprises a vertical stack comprising alternating insulative tiers and wordline tiers. The wordline tiers comprising gate regions of individual memory cells. The gate regions individually comprise part of a wordline in individual of the wordline tiers. The stack comprises an insulator tier above the wordline tiers. The insulator tier comprises lines of first insulator material comprising silicon, nitrogen, and one or more of carbon, oxygen, boron, and phosphorus. The first-insulator-material lines and the wordlines having a common longitudinal outline shape relative one another. Individual of the first-insulator-material lines are narrower than all of the wordlines directly there-below. Second insulator material is laterally over sidewalls of the first-insulator-material lines. The second insulator material is of different composition from that of the first insulator material. Elevationally-extending strings of the memory cells are in the stack.

In some embodiments, a memory array comprises a vertical stack comprising alternating insulative tiers and wordline tiers. The wordline tiers comprise gate regions of individual memory cells. The gate regions individually comprise part of a wordline in individual of the wordline tiers. The stack comprises an insulator tier above the wordline tiers. The insulator tier comprises lines of first insulator material comprising silicon, nitrogen, and one or more of carbon, oxygen, boron, and phosphorus. Lines of second insulator material are along sidewalls of the first-insulator-material lines. The second insulator material is of different composition from that of the first insulator material. The second-insulator-material-lines have individual bases that are above an uppermost of the wordline tiers. Elevationally-extending strings of the memory cells are in the stack.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
    forming a stack comprising vertically-alternating insulative tiers and wordline tiers, the stack comprising a horizontally-elongated insulator-material line that extends vertically through an uppermost of the insulative tiers and an uppermost of the wordline tiers;
    forming an insulator tier above the wordline tiers and above the horizontally-elongated insulator-material line; the insulator tier comprising a first insulator material comprising silicon, nitrogen, and one or more of carbon, oxygen, boron, and phosphorus;
    patterning the first insulator material to form first horizontally-elongated trenches in the insulator tier and to form horizontally-elongated first-insulator-material lines that individually have a longitudinal outline shape of individual wordlines to be formed in individual of the wordline tiers;
    forming horizontally-elongated lines of a second insulator material in the first trenches along sidewalls of the first-insulator-material lines, the second insulator material being of a different composition from that of the first insulator material and narrowing the first trenches, the second-insulator-material lines having individual bases that are above the uppermost of the wordline tiers;
    after forming the second-insulator-material lines, forming second horizontally-elongated trenches through the insulative tiers and the wordline tiers, the second trenches being horizontally along the narrowed first trenches laterally between and below the second-insulator-material lines and forming the wordline tiers to have the longitudinal outline shape of the individual wordlines in the individual wordline tiers;
    forming elevationally-extending strings of memory cells in the stack;
    forming a channel material vertically through the horizontally-elongated insulator-material line.

2. The method of claim 1 wherein said one or more of carbon, oxygen, boron, and phosphorus in the first insulator material has a total concentration of at least about 2 atomic percent.

3. The method of claim 2 wherein said total concentration is no more than about 20 atomic percent.

4. The method of claim 2 wherein said one or more of carbon, oxygen, boron, and phosphorus in the first insulator material has a total concentration of at least about 4 atomic percent.

5. The method of claim 4 wherein said total concentration is at least about 10 atomic percent.

6. The method of claim 1 wherein the one or more comprises carbon.

7. The method of claim 1 wherein the one or more comprises oxygen.

8. The method of claim 1 wherein the one or more comprises boron.

9. The method of claim 1 wherein the one or more comprises phosphorus.

10. The method of claim 1 wherein the one or more comprises only one of carbon, oxygen, boron, and phosphorus.

11. The method of claim 1 wherein the one or more comprises at least two of carbon, oxygen, boron, and phosphorus.

12. The method of claim 1 comprising forming the first trenches to extend through the first insulator material.

13. The method of claim 1 wherein the insulative tiers comprise an insulative material, the first insulator material being of a different composition from that of the insulative material of all of the insulative tiers.

14. The method of claim 1 wherein forming the second insulator material in the first trenches along the sidewalls of the first-insulator-material lines comprises:
    forming the second insulator material atop the first insulator material, along sidewalls of the first trenches, and directly above bases of the first trenches; and
    maskless anisotropically etching the second insulator material to remove such from being directly above the first-trench bases except where it is immediately adjacent the first-trench sidewalls and to remove such from being atop the first insulator material.

15. The method of claim 1 wherein,
    the patterning comprises forming a patterned masking layer atop the stack and using the patterned masking layer as a mask while etching the first insulator material to form the first horizontally-elongated trenches in the insulator tier; and
    the insulator tier is formed across a staircase region that is adjacent the memory array and where an electrical contact is made to the wordline tiers, the patterned masking layer being formed atop the insulator tier in the staircase region, and further comprising etching the first insulator material of the insulator tier in the staircase region using the patterned masking layer therein as a mask during the etching of the first insulator material to form the first horizontally-elongated trenches in the insulator tier that is in the memory array.

16. A method used in forming a memory array, comprising:
    forming a stack comprising vertically-alternating insulative tiers and wordline tiers, the stack comprising a horizontally-elongated insulator-material line that extends vertically through an uppermost of the insulative tiers and an uppermost of the wordline tiers;

forming an insulator tier above the wordline tiers and above the horizontally-elongated insulator-material line; the insulator tier comprising a first insulator material comprising silicon, nitrogen, and one or more of carbon, oxygen, boron, and phosphorus;

patterning the first insulator material to form first horizontally-elongated trenches in the insulator tier and to form horizontally-elongated first-insulator-material lines that individually have a longitudinal outline shape of individual wordlines to be formed in individual of the wordline tiers;

forming horizontally-elongated lines of a second insulator material in the first trenches along sidewalls of the first-insulator-material lines, the second insulator material being of a different composition from that of the first insulator material and narrowing the first trenches, the second-insulator-material lines having individual bases that are above the uppermost of the wordline tiers;

after forming the second-insulator-material lines, forming second horizontally-elongated trenches through the insulative tiers and the wordline tiers, the second trenches being horizontally along the narrowed first trenches laterally between and below the second-insulator-material lines and forming the wordline tiers to have the longitudinal outline shape of the individual wordlines in the individual wordline tiers;

forming elevationally-extending strings of memory cells in the stack; and forming longitudinally-spaced strings of a channel material vertically through the horizontally-elongated insulator-material line.

17. A method used in forming a memory array, comprising:

forming a stack comprising vertically-alternating insulative tiers and wordline tiers, the stack comprising a horizontally-elongated insulator-material line that extends vertically through an uppermost of the insulative tiers and an uppermost of the wordline tiers;

forming an insulator tier above the wordline tiers and above the horizontally-elongated insulator-material line; the insulator tier comprising a first insulator material comprising silicon, nitrogen, and one or more of carbon, oxygen, boron, and phosphorus;

patterning the first insulator material to form first horizontally-elongated trenches in the insulator tier;

forming a second insulator material in the first trenches along sidewalls of the first insulator material, the second insulator material being of a different composition from that of the first insulator material and narrowing the first trenches;

after forming the second insulator material, forming second horizontally-elongated trenches through the insulative tiers and the wordline tiers, the second trenches being horizontally along the narrowed first trenches laterally between and below the second insulator material;

forming elevationally-extending strings of memory cells in the stack;

forming a sacrificial material in the wordline tiers;

etching the sacrificial material away from the wordline tiers selectively relative to the insulative tiers;

replacing the sacrificial material from the wordline tiers with a conductive material that is used to form individual wordlines in the wordline tiers;

the second insulator material in the first trenches along the sidewalls of the first insulator material shielding the first insulator material from being laterally etched during the etching; and forming a channel material vertically through the horizontally-elongated insulator-material line.

18. A method used in forming a memory array, comprising:

forming a stack comprising vertically-alternating insulative tiers and wordline tiers, the stack comprising a horizontally-elongated insulator-material line that extends vertically through an uppermost of the insulative tiers and an uppermost of the wordline tiers;

forming an insulator tier above the wordline tiers and above the horizontally-elongated insulator-material line; the insulator tier comprising a first insulator material comprising silicon, nitrogen, and one or more of carbon, oxygen, boron, and phosphorus;

patterning the first insulator material to form first horizontally-elongated trenches in the insulator tier;

forming a second insulator material in the first trenches along sidewalls of the first insulator material, the second insulator material being of a different composition from that of the first insulator material and narrowing the first trenches;

after forming the second insulator material, forming second horizontally-elongated trenches through the insulative tiers and the wordline tiers, the second trenches being horizontally along the narrowed first trenches laterally between and below the second insulator material;

forming elevationally-extending strings of memory cells in the stack;

forming a sacrificial material in the wordline tiers;

etching the sacrificial material away from the wordline tiers selectively relative to the insulative tiers;

replacing the sacrificial material from the wordline tiers with a conductive material that is used to form individual wordlines in the wordline tiers;

the second insulator material in the first trenches along the sidewalls of the first insulator material shielding the first insulator material from being laterally etched during the etching; and forming longitudinally-spaced strings of a channel material vertically through the horizontally-elongated insulator-material line.

19. A method used in forming a memory array, comprising:

forming a stack comprising vertically-alternating insulative tiers and wordline tiers, the stack comprising an insulator tier above the wordline tiers;

the insulator tier comprising a first insulator material comprising silicon, nitrogen, and one or more of carbon, oxygen, boron, and phosphorus;

patterning the first insulator material to form first horizontally-elongated trenches in the insulator tier and to form horizontally-elongated first-insulator-material lines that individually have a longitudinal outline shape of individual wordlines to be formed in individual of the wordline tiers;

forming horizontally-elongated lines of a second insulator material in the first trenches along sidewalls of the first-insulator-material lines, the second insulator material being of a different composition from that of the first insulator material and narrowing the first trenches, the second-insulator-material lines having individual bases that are above an uppermost of the wordline tiers;

after forming the second-insulator-material lines, forming second horizontally-elongated trenches through the insulative tiers and the wordline tiers, the second trenches being horizontally along the narrowed first trenches laterally between and below the second-insulator-material lines and forming the wordline tiers to have the longitudinal outline shape of the individual wordlines in the individual wordline tiers;

forming elevationally-extending strings of memory cells in the stack, the strings of memory cells comprising channel-material strings;

forming individual void spaces that extend vertically through both of the insulator tier and an uppermost of the insulative tiers radially inward of the channel-material strings;

forming a first conductive via in individual of the void spaces radially inward of and directly against the channel material of the channel-material strings, the first conductive via extending vertically through each of the insulator tier and the uppermost insulative tier; and forming a second conductive via directly against a top surface of individual of the first conductive vias and which are individually radially offset from the first conductive vias and which are directly against the first insulator material.

* * * * *